United States Patent
Uneme

(10) Patent No.: US 10,658,942 B2
(45) Date of Patent: May 19, 2020

(54) ELEMENT UNIT

(71) Applicant: HONDA MOTOR CO., LTD., Minato-ku, Tokyo (JP)

(72) Inventor: Takahiro Uneme, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 16/267,405

(22) Filed: Feb. 5, 2019

(65) Prior Publication Data

US 2019/0252993 A1 Aug. 15, 2019

(30) Foreign Application Priority Data

Feb. 9, 2018 (JP) .................................. 2018-022545

(51) Int. Cl.
*H02M 7/00* (2006.01)
*H05K 7/02* (2006.01)
*H02M 7/5387* (2007.01)
*H02M 3/158* (2006.01)
*H02M 1/00* (2006.01)

(52) U.S. Cl.
CPC ........... *H02M 7/003* (2013.01); *H02M 3/158* (2013.01); *H02M 7/53875* (2013.01); *H05K 7/023* (2013.01); *H02M 2001/007* (2013.01); *H02M 2001/008* (2013.01)

(58) Field of Classification Search
CPC ............................... H02M 7/003; H05K 7/023
See application file for complete search history.

(56) References Cited

U.S. PATENT DOCUMENTS

2017/0155341 A1* 6/2017 Nomura .................. H01L 25/07

FOREIGN PATENT DOCUMENTS

| JP | 2006-040926 | 2/2006 |
| JP | 2006-066895 | 3/2006 |
| JP | 2008-042074 | 2/2008 |
| JP | 2009-089491 | 4/2009 |
| JP | 2012-235081 | 11/2012 |
| JP | 2014-093421 | 5/2014 |
| WO | 2009/150875 | 12/2009 |

OTHER PUBLICATIONS

Japanese Office Action for Japanese Patent Application No. 2018-022545 dated Nov. 5, 2019.

* cited by examiner

*Primary Examiner* — Adolf D Berhane
*Assistant Examiner* — Afework S Demisse
(74) *Attorney, Agent, or Firm* — Amin, Turocy & Watson, LLP

(57) ABSTRACT

There is provided an element unit including high side arm and low side arm transistors, a conductor set formed by disposing a positive bus bar and a negative bus bar to face each other while spaced apart in a Z axis direction, and a first bus bar. The first bus bar extends in the Z axis direction between a first insulating substrate and a second insulating substrate and is electrically connected to copper plates of the first insulating substrate and the second insulating substrate.

5 Claims, 18 Drawing Sheets

ELEMENT UNIT

CROSS-REFERENCE TO RELATED APPLICATION

Priority is claimed on Japanese Patent Application No. 2018-022545, filed Feb. 9, 2018, the content of which is incorporated herein by reference.

BACKGROUND OF THE INVENTION

Field of the Invention

The present invention relates to an element unit.

Description of Related Art

Conventionally, a power control unit including a plurality of semiconductor modules stacked and disposed in a first direction (a stacking direction) is known (for example, refer to Japanese Unexamined Patent Application, First Publication No. 2012-235081). Each of the semiconductor modules of the power control unit includes a first semiconductor element and a second semiconductor element arranged and disposed in a second direction (an arrangement direction) orthogonal to the first direction. The first semiconductor element and the second semiconductor element are disposed so that surfaces (for example, active surfaces on which a gate electrode is provided) thereof are orthogonal to the first direction. Each of the semiconductor modules is orthogonal to the first direction and the second direction and has three bus bars drawn out in a third direction parallel to a surface of each element, that is, tow bus bars for a power connection terminal and a bus bar for an output terminal.

SUMMARY OF THE INVENTION

However, in the power control unit according to the related art, when the two bus bars for a power connection terminal (that is, a positive electrode side bus bar and a negative electrode side bus bar) in each of the semiconductor modules are connected to an external capacitor and a power supply, a series circuit including the capacitor, the first semiconductor element, and the second semiconductor element is formed. In this series circuit, it is desired to reduce a surge voltage according to a switching operation of the first semiconductor element and the second semiconductor element by reducing a stray inductance.

However, when the positive electrode side bus bar and the negative electrode side bus bar are drawn out from positions away from each other in the arrangement direction of the first semiconductor element and the second semiconductor element like the semiconductor modules according to the above-described related art, there arises a problem that the total stray inductance of the series circuit increases due to a self-inductance of each of the bus bars.

An aspect of the present invention has been made in view of the above circumstances, and an object thereof is to provide an element unit capable of minimizing an increase in stray inductance.

In order to solve the above-described problem and to achieve the object, the present invention adopts the following aspect.

(1) An element unit according to one aspect of the present invention includes a high side arm element, a low side arm element, a conductor set formed by disposing a positive electrode side conductor, which is electrically connected to a first surface of the high side arm element, and a negative electrode side conductor, which is electrically connected to a first surface of the low side arm element, to face each other while spaced apart in a predetermined direction, a first conductor electrically connected to a second surface of the high side arm element, a second conductor electrically connected to a second surface of the low side arm element, and an input/output conductor electrically connected to the high side arm element and the low side arm element, wherein the input/output conductor extends in the predetermined direction between the first conductor and the second conductor and is electrically connected to the first conductor and the second conductor.

(2) In the aspect (1), the second conductor, the low side arm element, the negative electrode side conductor, the positive electrode side conductor, the high side arm element, and the first conductor may be sequentially disposed in the predetermined direction.

(3) In the aspect (2), the high side arm element, the conductor set, and the low side arm element may have portions which overlap each other when seen in the predetermined direction.

(4) In the aspect (2), the conductor set may have portions which overlap the high side arm element and the low side arm element when seen in the predetermined direction, and the high side arm element and the low side arm element may be disposed at positions which do not overlap each other when seen in the predetermined direction.

(5) In any one of the aspects (1) to (4), the input/output conductor may be disposed at a position which does not overlap the positive electrode side conductor and the negative electrode side conductor when seen in the predetermined direction.

(6) In the aspect (1), the element unit may further include a third conductor electrically connected to the first surface of the high side arm element and the positive electrode side conductor, and a fourth conductor electrically connected to the first surface of the low side arm element and the negative electrode side conductor, the third conductor, the positive electrode side conductor, the negative electrode side conductor, and the fourth conductor may be sequentially disposed in the predetermined direction, the third conductor, the high side arm element, and the first conductor may have portions which sequentially overlap when seen in the predetermined direction, and the second conductor, the low side arm element, and the fourth conductor may have portions which sequentially overlap when seen in the predetermined direction.

According to the aspect (1), since the positive electrode side conductor and the negative electrode side conductor extend to face each other, flowing directions of mutual currents are opposite to each other, and it is possible to reduce a stray inductance by a mutual magnetic flux offsetting action. In addition, a length of each of the positive electrode side conductor and the negative electrode side conductor is restrained from increasing at a portion not facing each other. That is, the stray inductance of the positive electrode side conductor and the negative electrode side conductor can reduce the stray inductance due to the mutual magnetic flux offsetting action and the restraining of the increase in the length.

In the case of the aspect (2), the second conductor, the low side arm element, the negative electrode side conductor, the positive electrode side conductor, the high side arm element, and the first conductor can be efficiently disposed while making electrical connection, and thus the increase in the stray inductance can be suppressed.

In the case of the aspect (3), since the high side arm element, the conductor set, and the low side arm element are disposed at positions which overlap each other, it is possible to restrain an increase in a planar size (area) of the element unit.

In the case of the aspect (4), since the high side arm element and the low side arm element are disposed at positions not overlapping each other, mutual thermal interference can be suppressed. For example, it is possible to suppress heat generation of any one of the high side arm element and the low side arm element from being transmitted to other elements.

In the case of the aspect (5), since the input/output conductor is disposed at a position which does not interfere with the positive electrode side conductor and the negative electrode side conductor, the input/output conductor can be easily drawn out from the element unit.

In the case of the aspect (6), each of the high side arm element and the low side arm element is disposed at the position not overlapping the insulating member which insulates the positive electrode side conductor and the negative electrode side conductor when seen in the predetermined direction and can be cooled from both sides in the predetermined direction, thus an increase in thermal resistance can be suppressed, and the cooling performance can be improved. Also, the increase in the stray inductance can be suppressed by restraining an increase in a thickness of the element unit in the predetermined direction and disposing it in a compact manner.

DETAILED DESCRIPTION OF THE INVENTION

Hereinafter, embodiments of the element unit of the present invention will be described below with reference to the accompanying drawings.

An element unit according to the embodiment constitutes, for example, part of a power conversion device. The power conversion device controls receiving and transmitting of electric power between a motor and a battery. For example, the power conversion device is mounted in an electric motor vehicle or the like. The electric motor vehicle includes an electric vehicle, a hybrid vehicle, a fuel cell vehicle, and so on. The electric vehicle is driven using a battery as a power source. The hybrid vehicle is driven using a battery and an internal combustion engine as a drive source. The fuel cell vehicle is driven using a fuel cell as a drive source.

First Example

Figure 1:
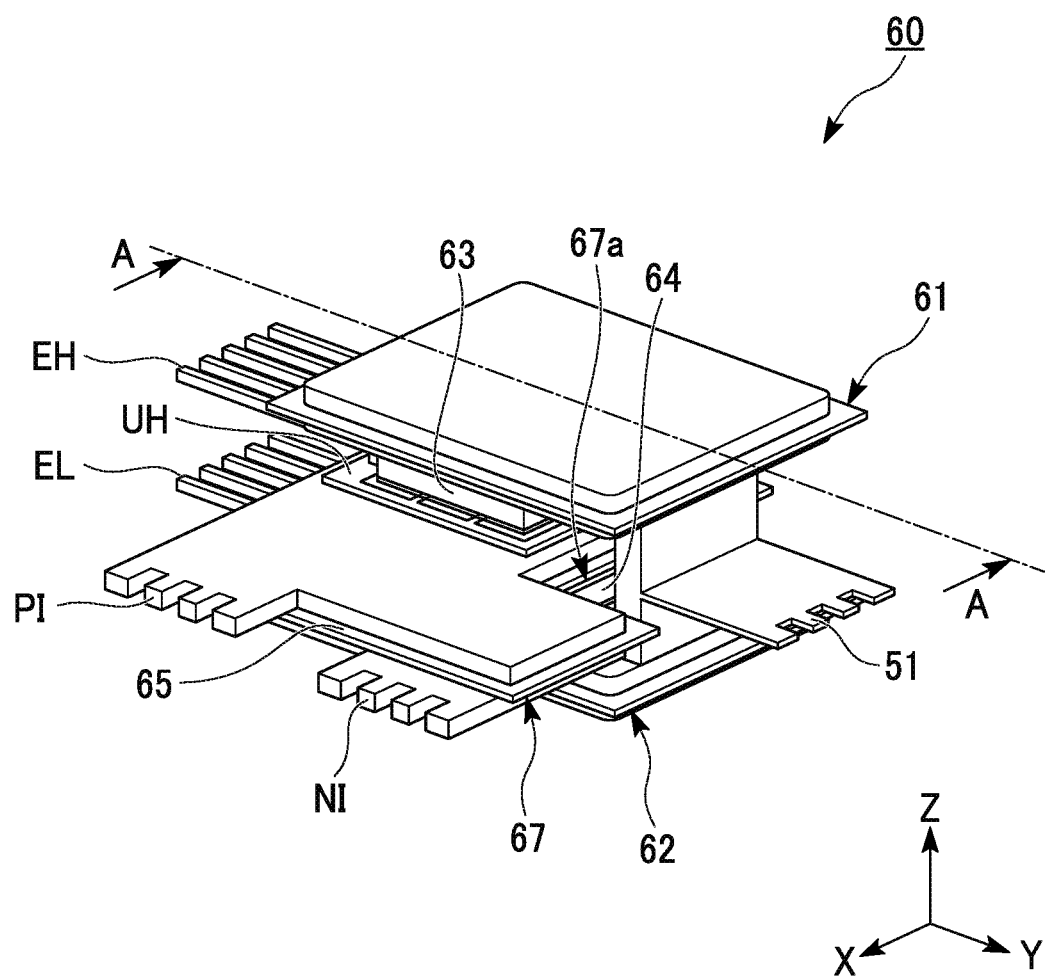
FIG. 1 is a perspective view schematically showing a constitution of an element unit according to a first example of an embodiment of the present invention.
Figure 2:
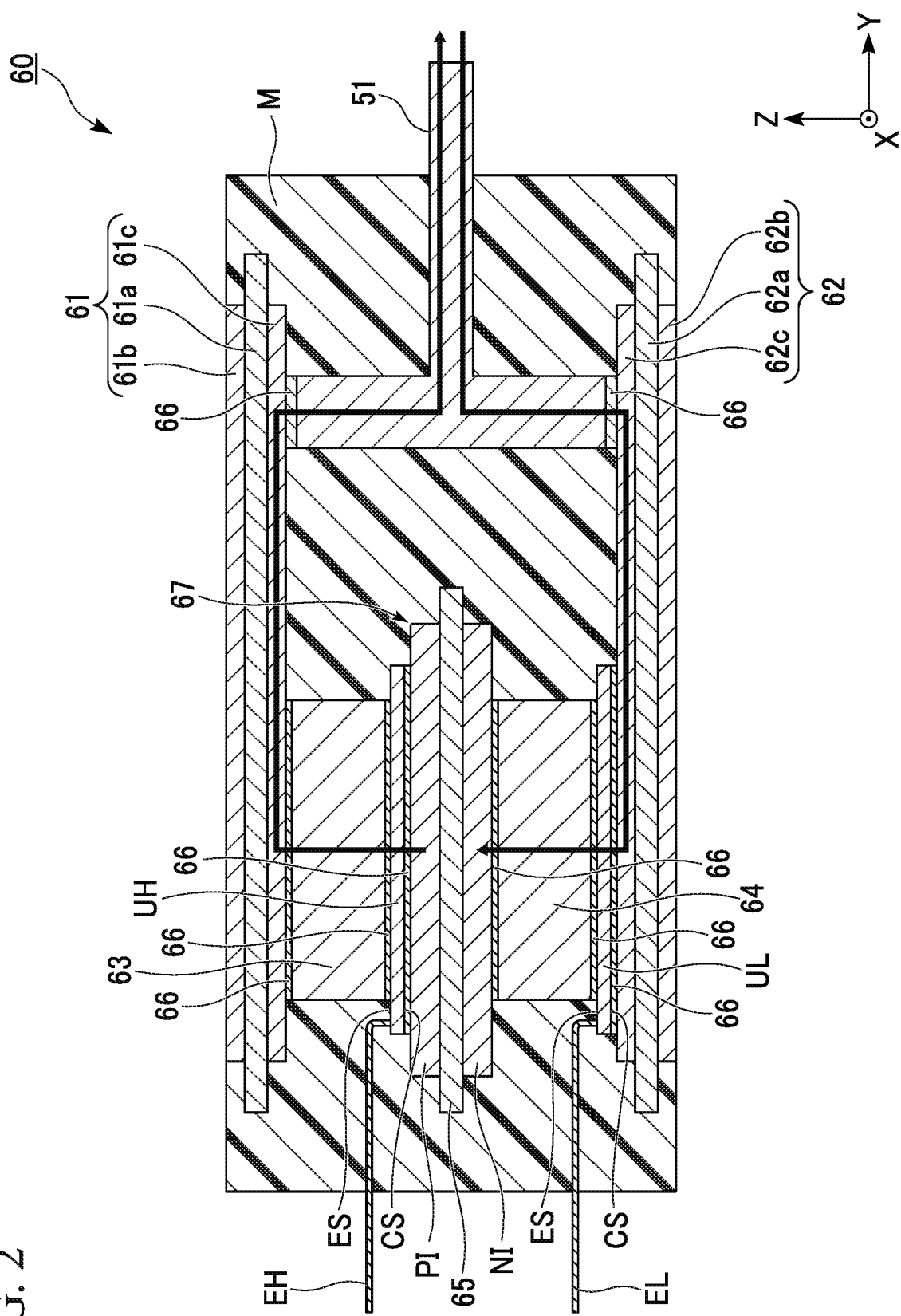
FIG. 2 is a diagram showing a current path in a cross-sectional view taken along a Y-Z plane at a position of line A-A shown in FIG. 1.
Figure 3:
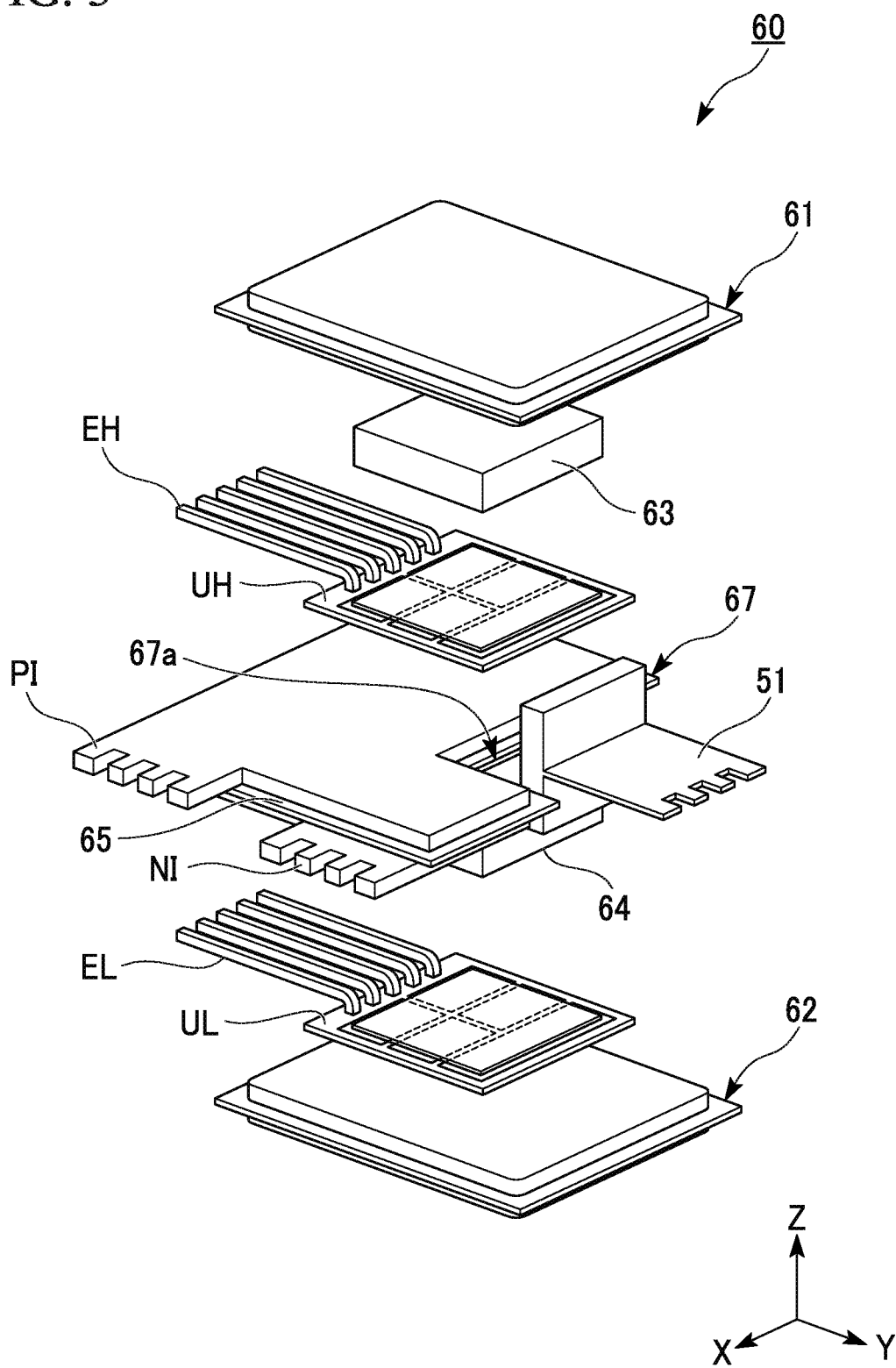
FIG. 3 is an exploded perspective view schematically showing the constitution of the element unit according to the first example of the embodiment of the present invention.
Figure 4:
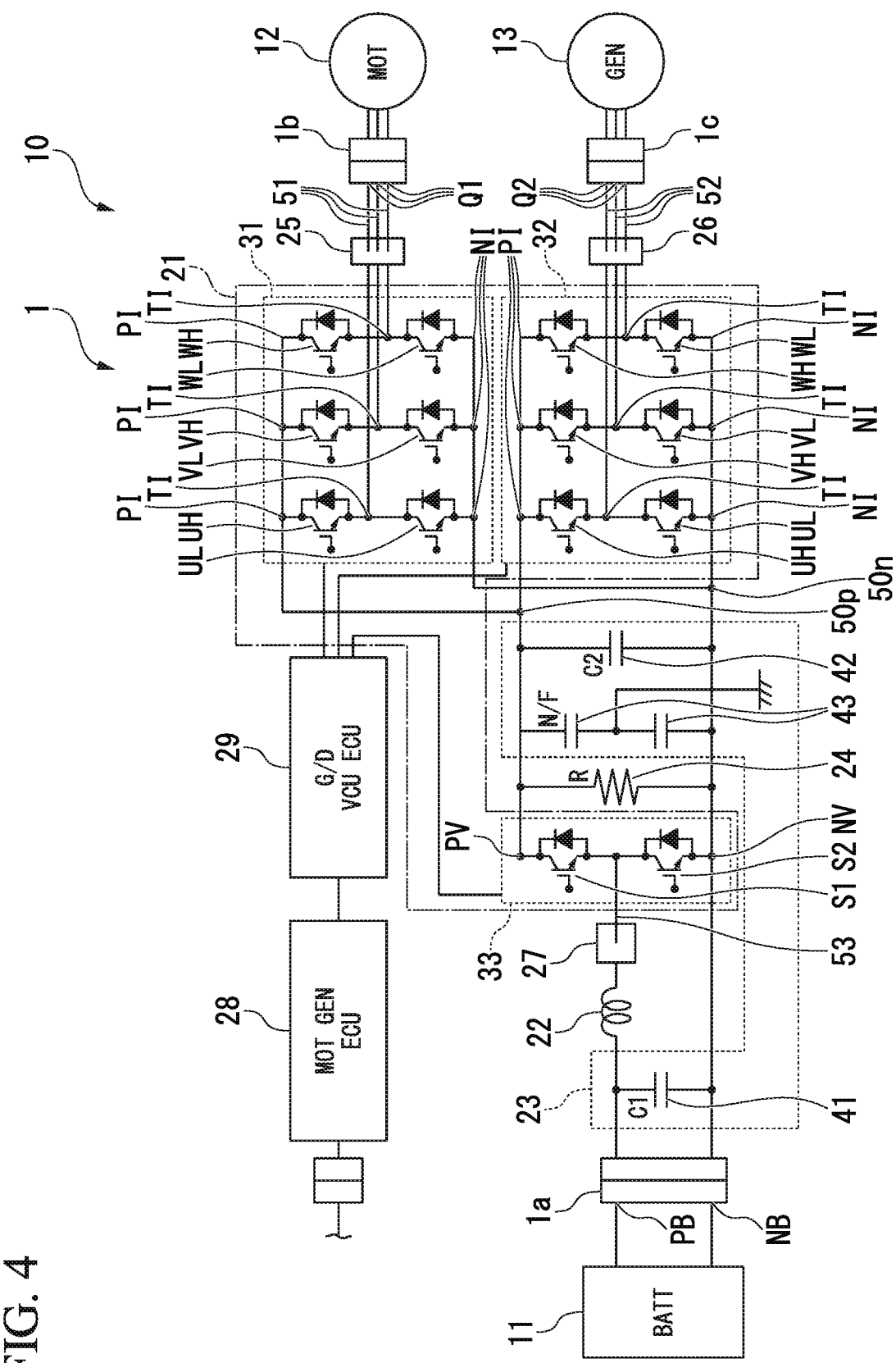
FIG. 4 is a diagram showing a constitution of part of a vehicle equipped with a power conversion device including the element unit according to the first example of the embodiment of the present invention.

FIG. 1 is a perspective view schematically showing a constitution of an element unit 60 according to a first example of an embodiment of the present invention. FIG. 2 is a diagram showing a current path in a cross-sectional view taken along a Y-Z plane at a position of line A-A shown in FIG. 1. FIG. 3 is an exploded perspective view schematically showing the constitution of the element unit 60 according to the first example of the embodiment of the present invention. FIG. 4 is a diagram showing a constitution of part of a vehicle 10 equipped with a power conversion device 1 including the element unit 60 according to the embodiment of the present invention.

<Vehicle>

As shown in FIG. 4, the vehicle 10 includes a battery 11 (BATT), a first motor 12 (MOT) for traveling and driving, and a second motor 13 (GEN) for power generation in addition to the power conversion device 1.

The battery 11 includes a battery case and a plurality of battery modules accommodated in the battery case. The battery module includes a plurality of battery cells which are connected in series. The battery 11 has a positive electrode terminal PB and a negative electrode terminal NB which are connected to a direct current (DC) connector 1a of the power conversion device 1. The positive electrode terminal PB and the negative electrode terminal NB are respectively connected to a positive electrode end and a negative electrode end of a plurality of battery modules connected in series in the battery case.

The first motor 12 generates a rotational driving force (a power operation) using electric power supplied from the battery 11. The second motor 13 generates generated electric power using the rotational driving force that is input to a rotating shaft. Here, rotational power of the internal combustion engine can be transmitted to the second motor 13. For example, each of the first motor 12 and the second motor 13 is a three-phase alternating current (AC) brushless DC motor. The three phases are a U-phase, a V-phase, and a W-phase. Each of the first motor 12 and the second motor 13 is an inner rotor type. Each of the motors 12 and 13 includes a rotor having a field permanent magnet and includes a stator having a three-phase stator winding for generating a rotating magnetic field which rotates the rotor. The three-phase stator winding of the first motor 12 is connected to a first three-phase connector 1b of the power conversion device 1. The three-phase stator winding of the second motor 13 is connected to a second three-phase connector 1c of the power conversion device 1.

<Power Conversion Device>

The power conversion device 1 includes a power module 21, a reactor 22, a capacitor unit 23, a resistor 24, a first current sensor 25, a second current sensor 26, a third current sensor 27, an electronic control unit 28 (MOT GEN ECU), and a gate drive unit 29 (G/D VCU ECU).

The power module 21 includes a first power conversion circuit unit 31, a second power conversion circuit unit 32, and a third power conversion circuit unit 33. The first power conversion circuit unit 31 is connected to the three-phase stator winding of the first motor 12 by the first three-phase connector 1b. The first power conversion circuit unit 31 converts DC power input from the battery 11 via the third power conversion circuit unit 33 into three-phase AC power. The second power conversion circuit unit 32 is connected to the three-phase stator winding of the second motor 13 by the second three-phase connector 1c. The second power conversion circuit unit 32 converts three-phase AC power input from the second motor 13 into DC power. The DC power converted by the second power conversion circuit unit 32 can be supplied to at least one of the battery 11 and the first power conversion circuit unit 31.

Each of the first power conversion circuit unit 31 and the second power conversion circuit unit 32 includes a bridge circuit formed by a plurality of switching elements which are bridge-connected. For example, the switching elements are transistors such as insulated gate bipolar transistors (IGBT) or metal oxide semi-conductor field effect transistors (MOSFET). For example, a pair of high side arm and low side arm U-phase transistors UH and UL, a pair of high side arm and low side arm V-phase transistors VH and VL, and a pair of high side arm and low side arm W-phase transistors WH and WL are respectively bridge-connected in the bridge circuit. In the embodiment, the high side arm and low side arm transistors (for example, the high side arm U-phase transistor UH and the low side arm U-phase transistor UL in the U-phase) constitute one element unit 60 in each of the U, V and W-phases.

A collector of each of the high side arm transistors UH, VH and WH is connected to a positive electrode bus bar PI to constitute a high side arm. In each phase, each positive electrode bus bar PI of the high side arm is connected to a positive electrode bus bar 50p of the capacitor unit 23.

An emitter of each of the low side arm transistors UL, VL and WL is connected to a negative electrode bus bar NI to constitute a low side arm. In each phase, each negative electrode bus bar NI of the lower side arm is connected to a negative electrode bus bar 50n of the capacitor unit 23.

In each phase, the emitters of the transistors UH, VH and WH of the high side arm are connected to the collectors of the transistors UL, VL and WL of the low side arm at a connection point TI.

A first bus bar 51 forming the connection point TI in each phase of the first power conversion circuit unit 31 is connected to a first input/output terminal Q1. The first input/output terminal Q1 is connected to the first three-phase connector 1b. The connection point TI in each phase of the first power conversion circuit unit 31 is connected to the stator winding in each phase of the first motor 12 via the first bus bar 51, the first input/output terminal Q1, and the first three-phase connector 1b.

A second bus bar 52 forming the connection point TI in each phase of the second power conversion circuit unit 32 is connected to a second input/output terminal Q2. The second input/output terminal Q2 is connected to the second three-phase connector 1c. The connection point TI in each phase of the second power conversion circuit unit 32 is connected to the stator winding in each phase of the second motor 13 via the second bus bar 52, the second input/output terminal Q2 and the second three-phase connector 1c.

The bridge circuit includes a diode connected in a forward direction from the emitter to the collector between the collector and the emitter of each of the transistors UH, UL, VH, VL, WH and WL.

Each of the first power conversion circuit unit 31 and the second power conversion circuit unit 32 switches the pair of transistors ON (conduction)/OFF (cutoff) in each phase based on a gate signal which is a switching instruction input to a gate of each of the transistors UH, VH, WH, UL, VL and WL from the gate drive unit 29. The first power conversion circuit unit 31 converts the DC power input from the battery 11 via the third power conversion circuit unit 33 into three-phase AC power and sequentially commutates the energization of the three-phase stator windings of the first motor 12, thereby conducting AC U-phase current, V-phase current, and W-phase current to the three-phase stator windings. The second power conversion circuit unit 32 converts the three-phase AC power output from the three-phase stator winding of the second motor 13 into DC power by turning on (conduction)/off (blocking) drive of the pair of transistors in each phase synchronized with rotation of the second motor 13.

The third power conversion circuit unit 33 is a voltage control unit (VCU). The third power conversion circuit unit 33 includes a pair of switching elements of the high side arm and the low side arm. For example, the third power conversion circuit unit 33 includes a first transistor S1 of the high side arm and a second transistor S2 of the low side arm. In the embodiment, the first transistor S1 and the second transistor S2 constitute one element unit 60.

A collector of the first transistor S1 is connected to a positive electrode bus bar PV to constitute the high side arm. The positive electrode bus bar PV of the high side arm is connected to the positive electrode bus bar 50*p* of the capacitor unit 23. An emitter of the second transistor S2 is connected to a negative electrode bus bar NV to form the low side arm. The negative electrode bus bar NV of the low side arm is connected to the negative electrode bus bar 50*n* of the capacitor unit 23. The negative electrode bus bar 50*n* of the capacitor unit 23 is connected to a negative electrode terminal NB of the battery 11. The emitter of the first transistor S1 of the high side arm is connected to the collector of the second transistor S2 of the low side arm. The third power conversion circuit unit 33 includes a diode connected in a forward direction from the emitter to the collector between the collector and the emitter of each of the first transistor S1 and the second transistor S2.

A third bus bar 53 forming a connection point between the first transistor S1 of the high side arm and the second transistor S2 of the low side arm is connected to the reactor 22. Both ends of the reactor 22 are connected to the connection point between the first transistor S1 and the second transistor S2 and the positive electrode terminal PB of the battery 11. The reactor 22 includes a coil and a temperature sensor for detecting a temperature of the coil. The temperature sensor is connected to the electronic control unit 28 by a signal line.

The third power conversion circuit unit 33 switches the pair of the transistors ON (conduction)/OFF (cutoff) based on a gate signal which is a switching instruction input to a gate of each of the first transistor S1 and the second transistor S2 from the gate drive unit 29.

The third power conversion circuit unit 33 alternately switches between a first state in which the second transistor S2 is turned on (conducted) and the first transistor S1 is turned off (cut off) and a second state in which the second transistor S2 is turned off (cut off) and the first transistor S1 is turned on (conducted) at the time of boosting. In the first state, a current sequentially flows to the positive electrode terminal PB of the battery 11, the reactor 22, the second transistor S2, and the negative electrode terminal NB of the battery 11, the reactor 22 is DC-excited, and magnetic energy is accumulated. In the second state, an electromotive voltage (an induced voltage) is generated between both ends of the reactor 22 to hinder a change in a magnetic flux caused by cutting off the current flowing through the reactor 22. The induced voltage caused by the magnetic energy accumulated in the reactor 22 is superimposed on a battery voltage, and a boosted voltage higher than a voltage between the terminals of the battery 11 is applied between the positive electrode bus bar PV and the negative electrode bus bar NV of the third power conversion circuit unit 33.

The third power conversion circuit unit 33 alternately switches between the second state and the first state at the time of regeneration. In the second state, a current flows sequentially to the positive electrode bus bar PV of the third power conversion circuit unit 33, the first transistor S1, the reactor 22, and the positive electrode terminal PB of the battery 11, the reactor 22 is DC-excited, and the magnetic energy is accumulated. In the first state, an electromotive voltage (an induced voltage) is generated between both ends of the reactor 22 so as to hinder the change in the magnetic flux caused by cutting off the current flowing through the reactor 22. The induced voltage caused by the magnetic energy accumulated in the reactor 22 is stepped down, and a step-down voltage lower than the voltage between the positive electrode bus bar PV and the negative electrode bus bar NV of the third power conversion circuit unit 33 is applied between the positive terminal PB and the negative terminal NB of the battery 11.

The capacitor unit 23 includes a first smoothing capacitor 41, a second smoothing capacitor 42, and a noise filter 43.

The first smoothing capacitor 41 is connected between the positive electrode terminal PB and the negative electrode terminal NB of the battery 11. The first smoothing capacitor 41 smooths voltage fluctuation caused by the ON/OFF switching operation of the first transistor S1 and the second transistor S2 at the time of regeneration of the third power conversion circuit unit 33.

The second smoothing capacitor 42 is connected between the positive electrode bus bar PI and the negative electrode bus bar NI of the first power conversion circuit unit 31 and the second power conversion circuit unit 32 and between the positive electrode bus bar PV and the negative electrode bus bar NV of the third power conversion circuit unit 33. The second smoothing capacitor 42 is connected to a plurality of positive electrode bus bars PI and negative electrode bus bars NI and the positive electrode bus bar PV and the negative electrode bus bar NV through the positive electrode bus bar 50*p* and the negative electrode bus bar 50*n*. The second smoothing capacitor 42 smooths the voltage fluctuation caused by the ON/OFF switching operation of each of the transistors UH, UL, VH, VL, WH and WL of the first power conversion circuit unit 31 and the second power conversion circuit unit 32. The second smoothing capacitor 42 smooths the voltage fluctuation caused by the ON/OFF switching operation of the first transistor S1 and the second transistor S2 at the time of boosting of the third power conversion circuit unit 33.

The noise filter 43 is connected between the positive electrode bus bar PI and the negative electrode bus bar NI of each of the first power conversion circuit unit 31 and the second power conversion circuit unit 32 and between the positive electrode bus bar PV and the negative electrode bus bar NV of the third power conversion circuit unit 33. The noise filter 43 includes two capacitors connected in series. A connection point between the two capacitors is connected to a body ground or the like of the vehicle 10.

The resistor 24 is connected between the positive electrode bus bar PI and the negative electrode bus bar NI of each of the first power conversion circuit unit 31 and the second power conversion circuit unit 32 and between the positive electrode bus bar PV and the negative electrode bus bar NV of the third power conversion circuit unit 33.

The first current sensor 25 constitutes the connection point TI in each phase of the first power conversion circuit unit 31, is disposed on the first bus bar 51 connected to the first input/output terminal Q1, and detects a current in each of the U-phase, V-phase, and W-phase. The second current sensor 26 constitutes the connection point TI in each phase of the second power conversion circuit unit 32, is disposed in the second bus bar 52 connected to the second input/output terminal Q2, and detects a current in each of the U-phase, V-phase, and W-phase. The third current sensor 27 is disposed on a third bus bar 53 which forms the connection point between the first transistor S1 and the second transistor S2 and is connected to the reactor 22, and the third current sensor 27 detects a current flowing through the reactor 22.

Each of the first current sensor 25, the second current sensor 26, and the third current sensor 27 is connected to the electronic control unit 28 by a signal line.

The electronic control unit 28 controls an operation of each of the first motor 12 and the second motor 13. For example, the electronic control unit 28 is a software function unit which functions when a predetermined program is executed by a processor such as a central processing unit (CPU). The software function unit is an electronic control unit (ECU) including a processor such as a CPU, a read only memory (ROM) which stores a program, a random access memory (RAM) which temporarily stores data, and electronic circuits such as a timer. At least part of the electronic control unit 28 may be an integrated circuit such as a large scale integration (LSI). For example, the electronic control unit 28 carries out current feedback control or the like using a current detection value of the first current sensor 25 and a current target value corresponding to a torque instruction value for the first motor 12 and generates a control signal which will be input to the gate drive unit 29. For example, the electronic control unit 28 carries out current feedback control or the like using a current detection value of the second current sensor 26 and a current target value corresponding to a regeneration instruction value for the second motor 13 and generates a control signal which will be input to the gate drive unit 29. The control signal is a signal which indicates a timing to turn on (conduct)/off (cut off) each of the transistors UH, VH, WH, UL, VL and WL of the first power conversion circuit unit 31 and the second power conversion circuit unit 32. For example, the control signal is a pulse width modulated signal or the like.

The gate drive unit 29 generates a gate signal which turns on (conducts)/off (cuts off) each of the transistors UH, VH, WH, UL, VL and WL of the first power conversion circuit unit 31 and the second power conversion circuit unit 32 on the basis of the control signal received from the electronic control unit 28. For example, the gate drive unit 29 carries out amplification and level shift of the control signal and generates the gate signal.

The gate drive unit 29 generates a gate signal which actually turns on (conducts)/off (cuts off) each of the first transistor S1 and the second transistor S2 of the third power conversion circuit unit 33. For example, the gate drive unit 29 generates the gate signal having a duty ratio corresponding to a step-up voltage instruction at the time of boosting of the third power conversion circuit unit 33 or a step-down voltage instruction at the time of regeneration of the third power conversion circuit unit 33. The duty ratio is a ratio of the first transistor S1 to the second transistor S2.

Also, the power conversion device 1 includes a heat radiation unit (not shown) for cooling the power module 21. For example, at least one of a refrigerant flow path through which a refrigerant flows and a fin which serves as a heat sink are provided in the heat radiation unit.

<Element Unit>

In each of the first power conversion circuit unit 31 and the second power conversion circuit unit 32 of the power module 21, the high side arm switching element and the low side arm switching element corresponding to each of the three phases (for example, the high side arm U-phase transistor UH and the low side arm U-phase transistor UL of the U-phase, or the like) constitute each of the element units 60. Further, in the third power conversion circuit unit 33, the switching elements of the high side arm and the low side arm (that is, the first transistor S1 and the second transistor S2) constitute one element unit 60. For example, since each of the element units 60 has the same constitution, the consti-tution of the element unit 60 including the high side arm U-phase transistor UH and the low side arm U-phase transistor UL in the U-phase of the first power conversion circuit unit 31 will be described as a representative example.

In the following, each axial direction of an X axis, a Y axis and a Z axis orthogonal to each other in a three-dimensional space is a direction parallel to each axis.

The element unit 60 includes a resin molded body M, high side arm and low side arm U-phase transistors UH and UL, a high side arm gate electrode EH and a low side arm gate electrode EL, a first insulating substrate 61 and a second insulating substrate 62, a first conductive spacer 63 and a second conductive spacer 64, a positive electrode bus bar PI and a negative electrode bus bar NI, an insulating member 65, and a first bus bar 51.

The resin molded body M is formed by molding using an electrically insulating resin material. In the resin molded body M, all constituent components of the element unit 60 are fixed by a resin material.

The high side arm and the low side arm U-phase transistors UH and UL are located at positions overlapping each other when seen in a Z axis direction in a state in which front and back sides thereof are disposed in the same direction in the Z axis direction. For example, each of the transistors UH and UL is disposed between the first insulating substrate 61 and the second insulating substrate 62 in the Z axis direction so that a surface ES thereof on the emitter side faces the first insulating substrate 61 side and a surface CS thereof on the collector side faces the second insulating substrate 62 side.

In the resin molded body M, each of the high side arm gate electrode EH and the low side arm gate electrode EL protrudes in the Z axis direction (for example, a positive direction of the Z axis) from the surface ES on the emitter side of each of the high side arm and low side arm U-phase transistors UH and UL and is curved in a Y axis direction (for example, a negative direction of the Y axis). Each of the high side arm gate electrode EH and the low side arm gate electrode EL has an end which protrudes outward in the Y axis direction (for example, the negative direction of the Y axis) from the resin molded body M, and each end thereof is connected to the gate drive unit 29.

The first insulating substrate 61 and the second insulating substrate 62 are disposed at positions overlapping each other at both ends of the resin molded body M in the Z axis direction when viewed in the Z axis direction. Each of the first insulating substrate 61 and the second insulating substrate 62 is constituted by an electrically insulating substrate and conductors provided on both surfaces of the substrate. For example, each of the first insulating substrate 61 and the second insulating substrate 62 is a direct copper bonding (DCB) substrate. The DCB substrate includes a ceramic substrate, a first copper plate, and a second copper plate provided on both surfaces of the ceramic substrate in a thickness direction. The first copper plate and the second copper plate sandwich the ceramic substrate from both sides in the thickness direction and are electrically insulated by the ceramic substrate.

Among the first copper plate 61b and the second copper plate 61c provided on the ceramic substrate 61a of the first insulating substrate 61, the first copper plate 61b is exposed outward from the resin molded body M in the Z axis direction (for example, in the positive direction of the Z axis). The first copper plate 61b is joined to the heat radiation unit (not shown) by, for example, a conductive joining material 66. The second copper plate 61c is electrically joined to the first conductive spacer 63 and the first bus bar 51 by the respective joining materials 66. For example, the joining material 66 is a solder or the like.

Among the first copper plate 62b and the second copper plate 62c provided on the ceramic substrate 62a of the second insulating substrate 62, the first copper plate 62b is exposed outward from the resin molded body M in the Z axis direction (for example, in the negative direction of the Z axis). The first copper plate 62b is joined to the heat radiation unit (not shown) by, for example, the joining material 66. The second copper plate 62c is electrically joined to the surface CS on the collector side of the low-side arm U-phase transistor UL and the first bus bar 51 by the respective joining materials 66.

Each of the first conductive spacer 63 and the second conductive spacer 64 is a conductor formed in a plate shape, for example, a copper plate or the like. The first conductive spacer 63 is disposed between the first insulating substrate 61 and the high side arm U-phase transistor UH in the Z axis direction and is electrically joined to the second copper plate 61c of the first insulating substrate 61 and the surface ES on the emitter side of the high side arm U-phase transistor UH by the respective joining materials 66. The second conductive spacer 64 is disposed between the low side arm U-phase transistor UL and the negative electrode bus bar NI in the Z axis direction and is electrically joined to the surface ES on the emitter side of the low side arm U-phase transistor UL and the negative electrode bus bar NI by the respective joining materials 66.

The positive electrode bus bar PI, the negative electrode bus bar NI, and the insulating member 65 constitute a conductor set 67. For example, the conductor set 67 is a direct copper bonding (DCB) substrate, each of the positive electrode bus bar PI and the negative electrode bus bar NI is a copper plate, and the insulating member 65 is a ceramic substrate. The positive electrode bus bar PI and the negative electrode bus bar NI are disposed to face each other while spaced apart in the Z axis direction, sandwich the insulating member 65 from both sides in the Z axis direction, and are electrically insulated by the insulating member 65. Each of the positive electrode bus bar PI and the negative electrode bus bar NI has an end which protrudes outward from the resin molded body M in an X axis direction (for example, in the positive direction of the X axis), and each of the ends is connected to each of the positive electrode bus bar 50p and the negative electrode bus bar 50n of the capacitor unit 23.

A cutout portion 67a which is partially cut out is formed in the conductor set 67 when seen in the Z axis direction between the second copper plate 61c of the first insulating substrate 61 and the second copper plate 62c of the second insulating substrate 62 in the resin molded body M. That is, part of the second copper plate 61c of the first insulating substrate 61 and part of the second copper plate 62c of the second insulating substrate 62 face each other in the Z axis direction through the cutout portion 67a of the conductor set 67.

In the resin molded body M, the positive electrode bus bar PI is electrically joined to the surface CS on the collector side of the high side arm U-phase transistor UH by the joining material 66. The negative electrode bus bar NI is electrically joined to the second conductive spacer 64 by the joining material 66 in the resin molded body M.

In the Z axis direction of the element unit 60, the second copper plate 62c of the second insulating substrate 62, the low side arm U-phase transistor UL, the second conductive spacer 64, the negative electrode bus bar NI, the insulating member 65, the positive electrode bus bar PI, the high side arm U-phase transistor UH, the first conductive spacer 63, and the second copper plate 61c of the first insulating substrate 61 are disposed sequentially.

When seen in the Z axis direction, the first conductive spacer 63, the high side arm U-phase transistor UH, the conductor set 67, the second conductive spacer 64, and the low side arm U-phase transistor UL have portions overlapping each other.

The first bus bar 51 is, for example, a plate-shaped conductor, like the copper plate. The first bus bar 51 is disposed in the cutout portion 67a of the conductor set 67 in the resin molded body M. That is, when seen in the Z axis direction, the first bus bar 51 is disposed at a position which does not overlap the positive electrode bus bar PI and the negative electrode bus bar NI. The first bus bar 51 extends through the cutout portion 67a of the conductor set 67 between the first insulating substrate 61 and the second insulating substrate 62 in the Z axis direction and is electrically joined to the second copper plate 61c of the first insulating substrate 61 and the second copper plate 62c of the second insulating substrate 62 by the respective joining materials 66.

The first bus bar 51 has a protruding portion which protrudes outward from the resin molded body M in the Y axis direction (for example, in the positive direction of the Y axis), and the protruding portion is joined to the U-phase stator winding of the first motor 12 via the first input/output terminal Q1 and the first three-phase connector 1b.

The current path on the positive electrode side in the element unit 60 of the first example is, sequentially, the positive electrode bus bar PI, the high side arm U-phase transistor UH, the first conductive spacer 63, the second copper plate 61c of the first insulating substrate 61, and the first bus bar 51. The current path on the negative electrode side is, sequentially, the first bus bar 51, the second copper plate 62c of the second insulating substrate 62, the low side arm U-phase transistor UL, the second conductive spacer 64, and the negative electrode bus bar NI.

In the element unit 60 of the first example, the positive electrode bus bar PI and the negative electrode bus bar NI are disposed so that at least parts thereof overlap each other when seen in the Z axis direction and flowing directions of the mutual currents are opposite to each other. A magnetic interaction, that is, a mutual magnetic flux offsetting action occurs according to such a relative arrangement state of the positive electrode bus bar PI and the negative electrode bus bar NI. Therefore, as a mutual inductance between the positive electrode bus bar PI and the negative electrode bus bar NI reduces a self-inductance of each of the positive electrode bus bar PI and the negative electrode bus bar NI, a stray inductance is reduced as a whole.

Figure 5:
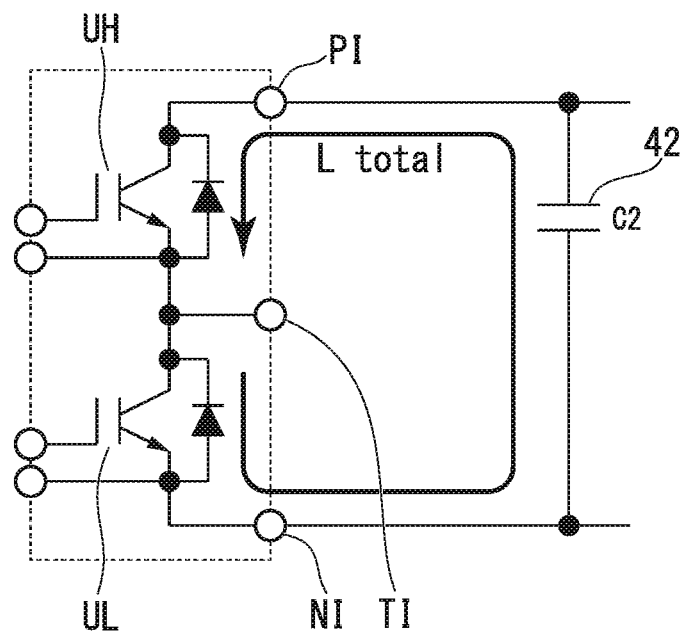
FIG. 5 is a diagram schematically showing a total stray inductance in a series circuit formed by a high side arm element, a low side arm element, and a smoothing capacitor of the element unit according to the first example of the embodiment of the present invention.
Figure 6:
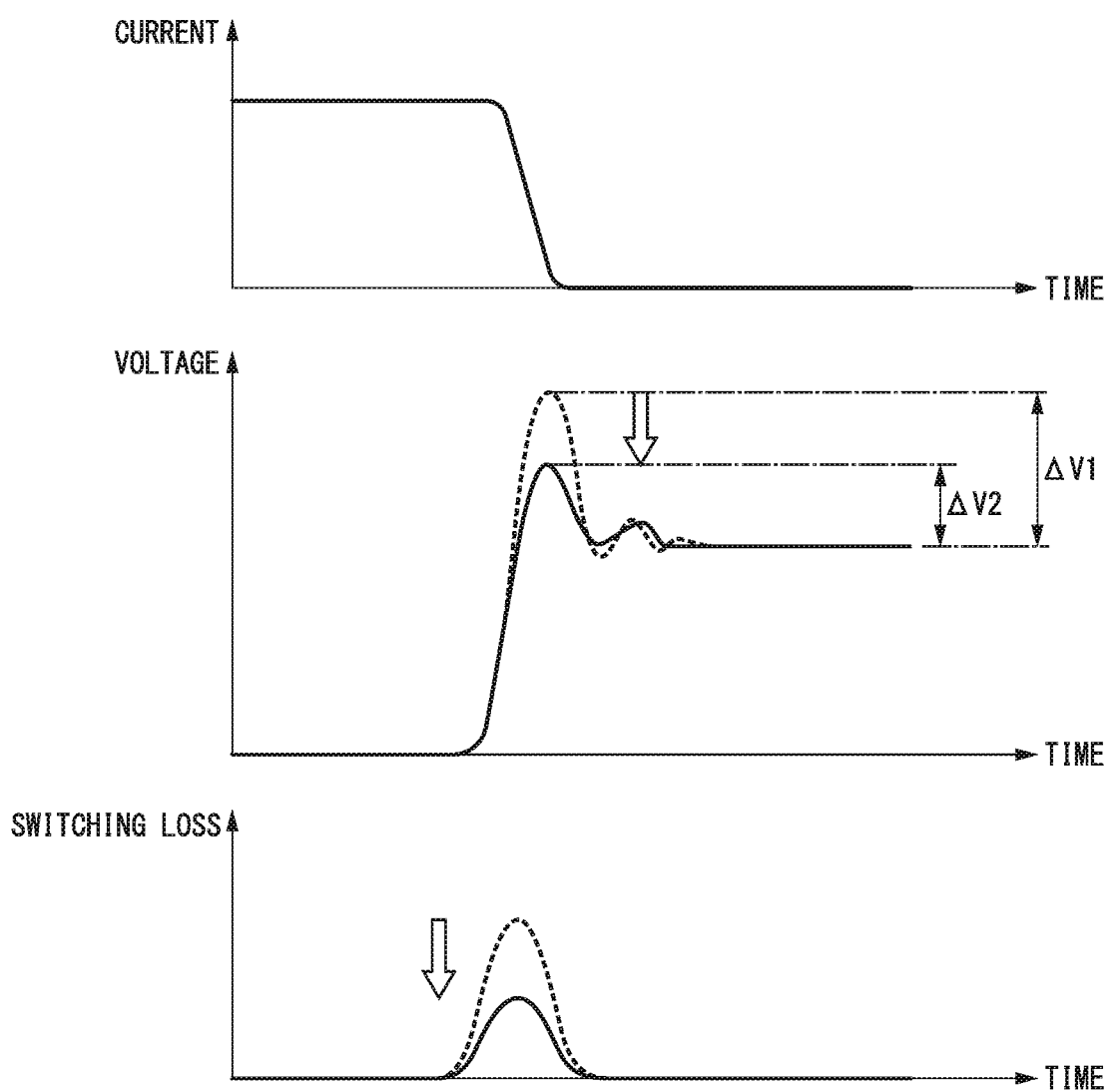
FIG. 6 is a diagram showing an example of a current, a voltage, and a switching loss of the high side arm element and the low side arm element of the element unit according to the first example of the embodiment of the present invention and a diagram showing a change in the switching loss in accordance with a change in a surge voltage.

FIG. 5 is a diagram schematically showing a total stray inductance $L_{total}$ in a series circuit formed by the high side arm and low side arm U-phase transistors UH and UL and the second smoothing capacitor 42. FIG. 6 is a diagram showing an example of a current, a voltage, and a switching loss of the high side arm and low side arm U-phase transistors UH and UL in the series circuit shown in FIG. 5 and a diagram showing a change in the switching loss in accordance with a change in a surge voltage.

As shown in FIG. 5, the surge voltage $\Delta V$ is described as $\Delta V = L_{total} \times (di/dt)$ by the total stray inductance $L_{total}$ in the series circuit formed by the high side arm and low side arm U-phase transistors UH and UL and the second smoothing capacitor 42, and the current change (di/dt) caused by the switching of each of the high side arm and low side arm U-phase transistors UH and UL.

Therefore, the surge voltage ΔV is lowered by reducing the stray inductance $L_{total}$ of this series circuit due to the magnetic interaction according to the relative arrangement state of the positive electrode bus bar PI and the negative electrode bus bar NI. As shown in FIG. 6, the switching loss of each of the high side arm and low side arm U-phase transistors UH and UL is reduced in response to the surge voltage ΔV being lowered from ΔV1 to ΔV2 according to the relative arrangement state of the positive electrode bus bar PI and the negative electrode bus bar NI with respect to the current change caused by the switching of each of the high side arm and low side arm U-phase transistors UH and UL.

Although the U-phase element unit 60 of the first power conversion circuit unit 31 has been described above, the element unit 60 in each of the V-phase and the W-phase of the first power conversion circuit unit 31 includes each of the V-phase transistors VH and VL or each of the W-phase transistors WH and WL in place of each of the U-phase transistors UH and UL. Furthermore, the element unit 60 in each phase of the second power conversion circuit unit 32 includes the second bus bar 52 instead of the first bus bar 51.

Also, in comparison with the element unit 60 in the U-phase of the first power conversion circuit unit 31, the element unit 60 of the third power conversion circuit unit 33 includes the first and second transistors S1 and S2 instead of each of the U-phase transistors UH and UL, includes the positive electrode bus bar PV and the negative electrode bus bar NV instead of the positive electrode bus bar PI and the negative electrode bus bar NI, and includes the third bus bar 53 instead of the first bus bar 51.

As described above, according to the element unit 60 according to the first example of the embodiment, since the positive electrode bus bar PI (PV) and the negative electrode bus bar NI (NV) extend to face each other at an inner side and an outer side of the resin molded body M and the flowing directions of the mutual currents are opposite to each other, it is possible to reduce the stray inductance due to the mutual magnetic flux offsetting action. In addition, a length of each of the positive electrode bus bar PI (PV) and the negative electrode bus bar NI (NV) is restrained from increasing at portions which do not face each other. That is, the positive electrode bus bar PI (PV) and the negative electrode bus bar NI (NV) can reduce the stray inductance due to the mutual magnetic flux offsetting action and the restraining of the increase in the length.

Further, since the positive electrode bus bar PI (PV) and the negative electrode bus bar NI (NV) extend toward the capacitor unit 23 while facing each other even at the outer side of the element unit 60, it is possible to restrain the increase in the length of each of the positive electrode bus bar PI (PV) and the negative electrode bus bar NI (NV) until when connected to the capacitor unit 23, thereby suppressing an increase in the stray inductance.

Due to the reduction of the stray inductance and the suppression of the increase in the stray inductance, it is possible to reduce the surge voltage caused by the switching of each of the transistors UH, VH, WH, S1, UL, VL, WL and S2 and to reduce the switching loss.

Also, in the Z axis direction, each of the second copper plates 61c and 62c, each of the transistors UH (VH, WH, S1) and UL (VL, WL, S2), each of the spacers 63 and 64, and the conductor set 67 can be electrically connected while efficiently disposing them in a compact manner.

Further, when seen in the Z axis direction, since each transistor UH (VH, WH, S1) of the high side arm and each transistor UL (VL, WL, S2) of the low side arm are disposed at the portions which overlap each other, it is possible to restrain an increase in a planar size (area) of the element unit 60 in the X axis direction and the Y axis direction. Accordingly, the positive electrode bus bar PI (PV) and the negative electrode bus bar NI (NV) are restrained from being lengthened, and the increase in the stray inductance can be suppressed.

Furthermore, since each of the first to third bus bars 51, 52 and 53 is disposed without interfering with the conductor set 67 while connecting the two second copper plates 61c and 62c, it can be easily drawn out to the outside of the resin molded body M.

Second Example

Figure 7:
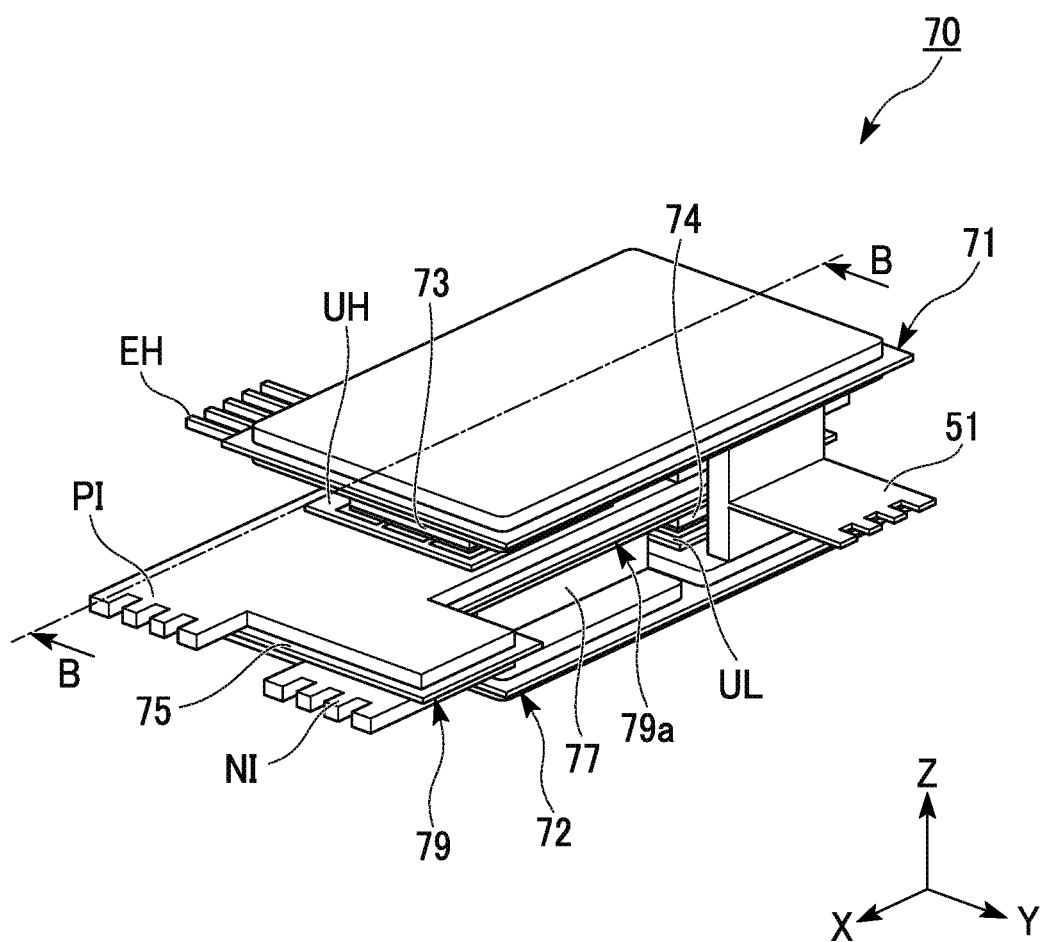
FIG. 7 is a perspective view schematically showing a constitution of an element unit according to a second example of the embodiment of the present invention.
Figure 8:
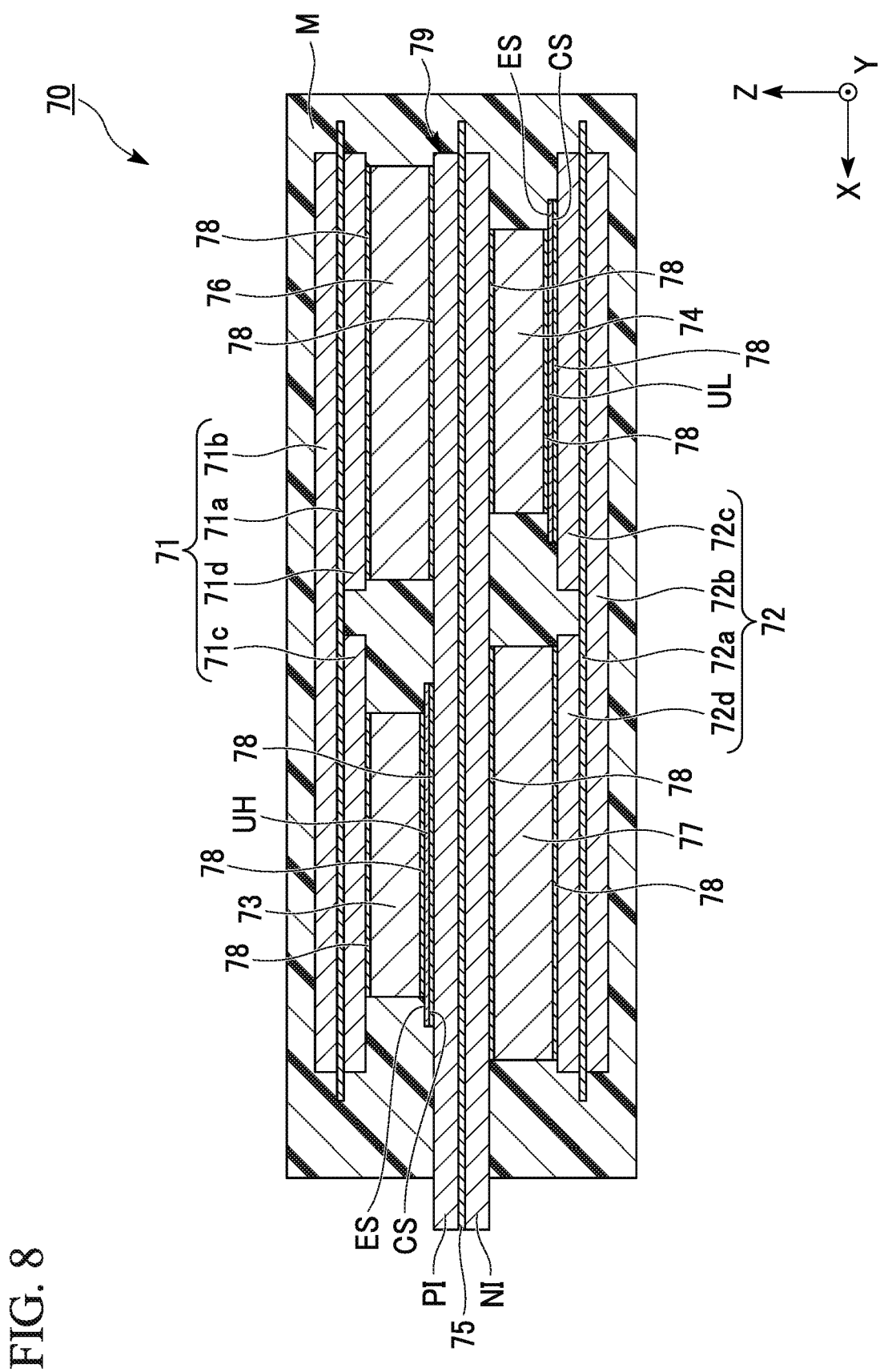
FIG. 8 is a diagram showing a current path in a cross-sectional view taken along the Y-Z plane at a position of line B-B shown in FIG. 7.
Figure 9:
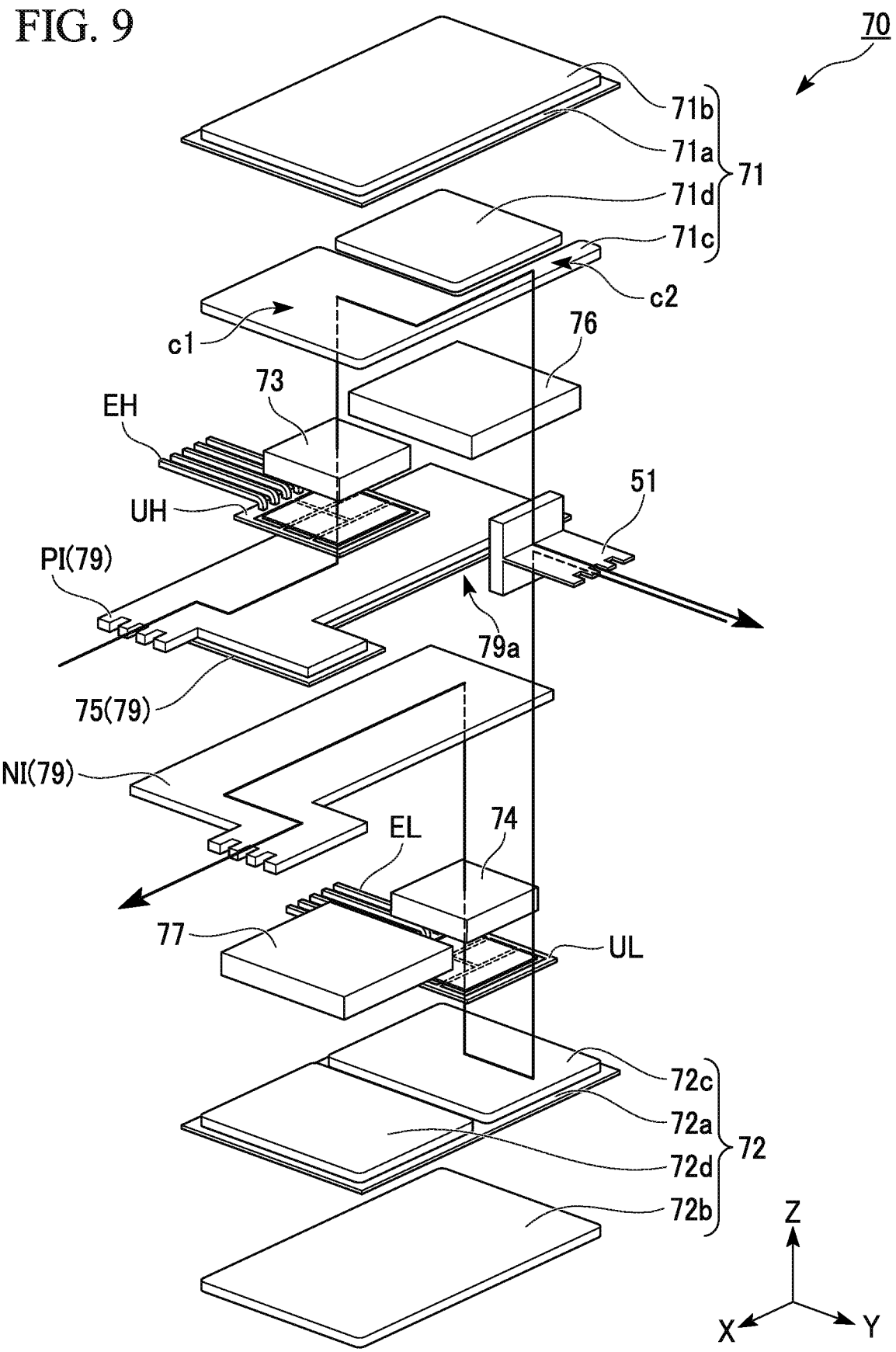
FIG. 9 is a diagram showing a current path in an exploded perspective view schematically showing the constitution of the element unit according to the second example of the embodiment of the present invention.

FIG. 7 is a perspective view schematically showing a constitution of an element unit 70 according to a second example of the embodiment of the present invention. FIG. 8 is a cross-sectional view taken along the Y-Z plane at a position of line B-B shown in FIG. 7. FIG. 9 is a diagram showing a current path in an exploded perspective view schematically showing the constitution of the element unit according to the second example of the embodiment of the present invention.

<Element Unit>

In the following, the constitution of the element unit 70 including the high side arm U-phase transistor UH and the low side arm U phase transistor UL in the U-phase of the first power conversion circuit unit 31 will be described as a representative example of the element unit 70 according to the second example, like the first example.

The element unit 70 includes a resin molded body M, high side arm and low side arm U-phase transistors UH and UL, a high side arm gate electrode EH and a low side arm gate electrode EL, a first insulating substrate 71 and a second insulating substrate 72, a first conductive spacer 73 and a second conductive spacer 74, a positive electrode bus bar PI and a negative electrode bus bar NI, an insulating member 75, a first spacer 76 and a second spacer 77, and a first bus bar 51.

The resin molded body M is formed by molding using an electrically insulating resin material. In the resin molded body M, all constituent components of the element unit 70 are fixed by a resin material.

The high side arm and the low side arm U-phase transistors UH and UL are located at positions which do not overlap each other when seen in a Z axis direction in a state in which front and back sides thereof are disposed in the same direction in the Z axis direction. For example, each of the transistors UH and UL is disposed between the first insulating substrate 71 and the second insulating substrate 72 in the Z axis direction so that a surface ES thereof on the emitter side faces the first insulating substrate 71 side and a surface CS thereof on the collector side faces the second insulating substrate 72 side. The high side arm and low side arm U-phase transistors UH and UL are disposed apart from each other, for example, in the Z axis direction and the X axis direction at the same position in the Y axis direction.

In the resin molded body M, each of the high side arm gate electrode EH and the low side arm gate electrode EL protrudes in the Z axis direction (for example, a positive direction of the Z axis) from the surface ES on the emitter side of each of the high side arm and low side arm U-phase transistors UH and UL and is curved in a Y axis direction (for example, a negative direction of the Y axis). Each of the high side arm gate electrode EH and the low side arm gate electrode EL has an end which protrudes outward in the Y axis direction (for example, the negative direction of the Y axis) from the resin molded body M, and each end thereof is connected to the gate drive unit 29.

The first insulating substrate 71 and the second insulating substrate 72 are disposed at positions overlapping each other at both ends of the resin molded body M in the Z axis direction when viewed in the Z axis direction. Each of the first insulating substrate 71 and the second insulating substrate 72 is constituted by an electrically insulating substrate and conductors provided on both surfaces of the substrate. For example, each of the first insulating substrate 71 and the second insulating substrate 72 is a direct copper bonding (DCB) substrate. The DCB substrate includes a ceramic substrate, and a first copper plate, a second copper plate and a third copper plate are provided on both surfaces of the ceramic substrate in a thickness direction.

The first copper plate, the second copper plate and the third copper plate sandwich the ceramic substrate from both sides in the thickness direction and are electrically insulated by the ceramic substrate. The second copper plate and the third copper plate are electrically insulated by being spaced apart from each other at a predetermined interval.

Among the first copper plate 71b, the second copper plate 71c and the third copper plate 71d provided on the ceramic substrate 71a of the first insulating substrate 71, the first copper plate 71b is exposed outward from the resin molded body M in the Z axis direction (for example, in the positive direction of the Z axis). The first copper plate 71b is joined to a heat radiation unit (not shown) by, for example, a conductive joining material 78. For example, the joining material 78 is a solder or the like.

An outer shape of each of the second copper plate 71c and the third copper plate 71d is formed into, for example, a plate shape having a different shape. The second copper plate 71c includes a first plate-shaped portion c1 and a second plate-shaped portion c2 which protrudes from the first plate-shaped portion c1. For example, the first plate-shaped portion c1 of the second copper plate 71c and the third copper plate 71d are arranged and disposed at a predetermined interval in the X axis direction, and the second plate-shaped portion c2 of the second copper plate 71c and the third copper plate 71d are arranged and disposed at a predetermined interval in the Y axis direction.

In the second copper plate 71c, the first plate-shaped portion c1 is electrically joined to the first conductive spacer 73 by the joining material 78, and the second plate-shaped portion c2 is electrically joined to the first bus bar 51 by the joining material 78.

The third copper plate 71d is electrically and thermally joined to the first spacer 76 by the joining material 78.

Among the first copper plate 72b, the second copper plate 72c, and the third copper plate 72d provided on the ceramic substrate 72a of the second insulating substrate 72, the first copper plate 72b is exposed outward from the resin molded body M in the Z axis direction (for example, in the negative direction of the Z axis). The first copper plate 72b is joined to a heat radiation unit (not shown) by, for example, the joining material 78.

An outer shape of each of the second copper plate 72c and the third copper plate 72d is formed into, for example, plate shapes having the same shape. For example, the second copper plate 72c and the third copper plate 72d are arranged and disposed at a predetermined interval in the Y axis direction.

The second copper plate 72c is electrically joined to the surface CS on the collector side of the low side arm U-phase transistor UL and the first bus bar 51 by the respective joining materials 78. The third copper plate 72d is electrically and thermally joined to the second spacer 77 by the joining material 78.

Each of the first conductive spacer 73 and the second conductive spacer 74 is a conductor formed in a plate shape, for example, like a copper plate or the like. The first conductive spacer 73 is disposed between the first insulating substrate 71 and the high side arm U-phase transistor UH in the Z axis direction and is electrically joined to the first plate-shaped portion c1 of the second copper plate 71c of the first insulating substrate 71 and the surface ES on the emitter side of the high side arm U-phase transistor UH by the respective joining materials 78. The second conductive spacer 74 is disposed between the low side arm U-phase transistor UL and the negative electrode bus bar NI in the Z axis direction and is electrically joined to the surface ES on the emitter side of the low side arm U-phase transistor UL and the negative electrode bus bar NI by the respective joining materials 78.

The positive electrode bus bar PI, the negative electrode bus bar NI, and the insulating member 75 constitute a conductor set 79. For example, the conductor set 79 is a direct copper bonding (DCB) substrate, each of the positive electrode bus bar PI and the negative electrode bus bar NI is a copper plate, and the insulating member 75 is a ceramic substrate. The positive electrode bus bar PI and the negative electrode bus bar NI are disposed to face each other while spaced apart in the Z axis direction, sandwich the insulating member 75 from both sides in the Z axis direction, and are electrically insulated by the insulating member 75. Each of the positive electrode bus bar PI and the negative electrode bus bar NI has an end which protrudes outward from the resin molded body M in an X axis direction (for example, in the positive direction of the X axis), and each of the ends is connected to each of the positive electrode bus bar 50p and the negative electrode bus bar 50n of the capacitor unit 23.

A cutout portion 79a which is partially cut out is formed in the conductor set 79 when seen in the Z axis direction between at least the second plate-shaped portion c2 of the second copper plate 71c of the first insulating substrate 71 and the second copper plate 72c of the second insulating substrate 72 in the resin molded body M. That is, parts of the second plate-shaped portion c2 of the second copper plate 71c of the first insulating substrate 71 and the second copper plate 72c of the second insulating substrate 72 face each other in the Z axis direction through the cutout portion 79a of the conductor set 79.

In the resin molded body M, the positive electrode bus bar PI is electrically joined to the surface CS on the collector side of the high side arm U-phase transistor UH and the first spacer 76 by the joining material 78. The negative electrode bus bar NI is electrically joined to the second conductive spacer 74 and the second spacer 77 by the joining material 78 in the resin molded body M.

Each of the first spacer 76 and the second spacer 77 is a conductor having a high thermal conductivity formed in a plate shape, like the copper plate. The first spacer 76 is disposed between the first insulating substrate 71 and the positive electrode bus bar PI in the Z axis direction and is electrically and thermally joined to the third copper plate 71d of the first insulating substrate 71 and the positive electrode bus bar PI by the respective joining materials 78. The second spacer 77 is disposed between the negative electrode bus bar NI and the second insulating substrate 72 in the Z axis direction and is electrically and thermally joined to the negative electrode bus bar NI and the third copper plate 72d of the second insulating substrate 72 by the respective joining materials 78.

In the Z axis direction of the element unit 70, the second copper plate 72c and the third copper plate 72d of the second insulating substrate 72, the low side arm U-phase transistor UL, the second conductive spacer 74, the second spacer 77, the negative electrode bus bar NI, the insulating member 75, the positive electrode bus bar PI, the high side arm U-phase transistor UH, the first conductive spacer 73, the first spacer 76, and the second copper plate 71c and the third copper plate 71d of the first insulating substrate 71 are sequentially disposed.

When seen in the Z axis direction, the conductor set 79 has portions which overlap the first conductive spacer 73 and the second conductive spacer 74, the high side arm and low side arm U-phase transistors UH and UL, and the first spacer 76 and the second spacer 77.

When seen in the Z axis direction, the first conductive spacer 73, the high side arm U-phase transistor UH, and the second spacer 77 have portions which overlap each other. When seen in the Z axis direction, the first spacer 76, the second conductive spacer 74 and the low side arm U-phase transistor UL have portions which overlap each other. When seen in the Z axis direction, the first conductive spacer 73, the high side arm U-phase transistor UH, and the second spacer 77, the first spacer 76, the second conductive spacer 74, and the low side arm U-phase transistor UL are disposed not to overlap each other when seen in the Z axis direction (for example, not to have portions which are spaced apart from each other in the X axis direction and do not overlap each other).

The first bus bar 51 is a plate-shaped conductor, like the copper plate. The first bus bar 51 is disposed in the cutout portion 79a of the conductor set 79 in the resin molded body M. That is, when seen in the Z axis direction, the first bus bar 51 is disposed at a position which does not overlap the positive electrode bus bar PI and the negative electrode bus bar NI. The first bus bar 51 extends through the cutout portion 79a of the conductor set 79 between the first insulating substrate 71 and the second insulating substrate 72 in the Z axis direction and is electrically joined to the second plate-shaped portion c2 of the second copper plate 71c of the first insulating substrate 71 and the second copper plate 72c of the second insulating substrate 72 by the respective joining materials 78.

The first bus bar 51 has a protruding portion which protrudes outward from the resin molded body M in the Y axis direction (for example, in the positive direction of the Y axis), and the protruding portion is connected to the U-phase stator winding of the first motor 12 via the first input/output terminal Q1 and the first three-phase connector 1b.

As shown in FIG. 9, the current path on the positive electrode side in the element unit 70 of the second example is sequentially constituted by the positive electrode bus bar PI, the high side arm U-phase transistor UH, the first conductive spacer 73, the second copper plate 71c of the first insulating substrate 71, and the first bus bar 51. As shown in FIG. 9, the current path on the negative electrode side is sequentially constituted by the first bus bar 51, the second copper plate 72c of the second insulating substrate 72, the low side arm U-phase transistor UL, the second conductive spacer 74, and the negative electrode bus bar NI.

Although the U-phase element unit 70 of the first power conversion circuit unit 31 has been described above, the element unit 70 in each of the V-phase and the W-phase of the first power conversion circuit unit 31 includes each of the V-phase transistors VH and VL or each of the W-phase transistors WH and WL in place of each of the U-phase transistors UH and UL. Furthermore, the element unit 70 in each phase of the second power conversion circuit unit 32 includes the second bus bar 52 instead of the first bus bar 51.

Also, in comparison with the element unit 70 in the U-phase of the first power conversion circuit unit 31, the element unit 70 of the third power conversion circuit unit 33 includes the first and second transistors S1 and S2 instead of each of the U-phase transistors UH and UL, includes the positive electrode bus bar PV and the negative electrode bus bar NV instead of the positive electrode bus bar PI and the negative electrode bus bar NI, and includes the third bus bar 53 instead of the first bus bar 51.

As described above, according to the element unit 70 according to the second example of the embodiment, since each of the transistors UH (VH, WH, S1) of the high side arm and each of the transistors UL (VL, WL, S2) of the low side arm are disposed at positions which do not overlap each other when seen in the Z axis direction, it is possible to minimize mutual thermal interference. For example, it is possible to suppress heat generation of the transistor of any one of the high side arm and the low side arm from being transmitted to other transistors.

Furthermore, since the first spacer 76 and the second spacer 77 for heat radiation are provided independently from the current path in the element unit 70, it is possible to improve cooling performance of each of the transistors UH (VH, WH, S1) of the high side arm and each of the transistors UL (VL, WL, S2) of the low side arm.

Third Example

Figure 10:
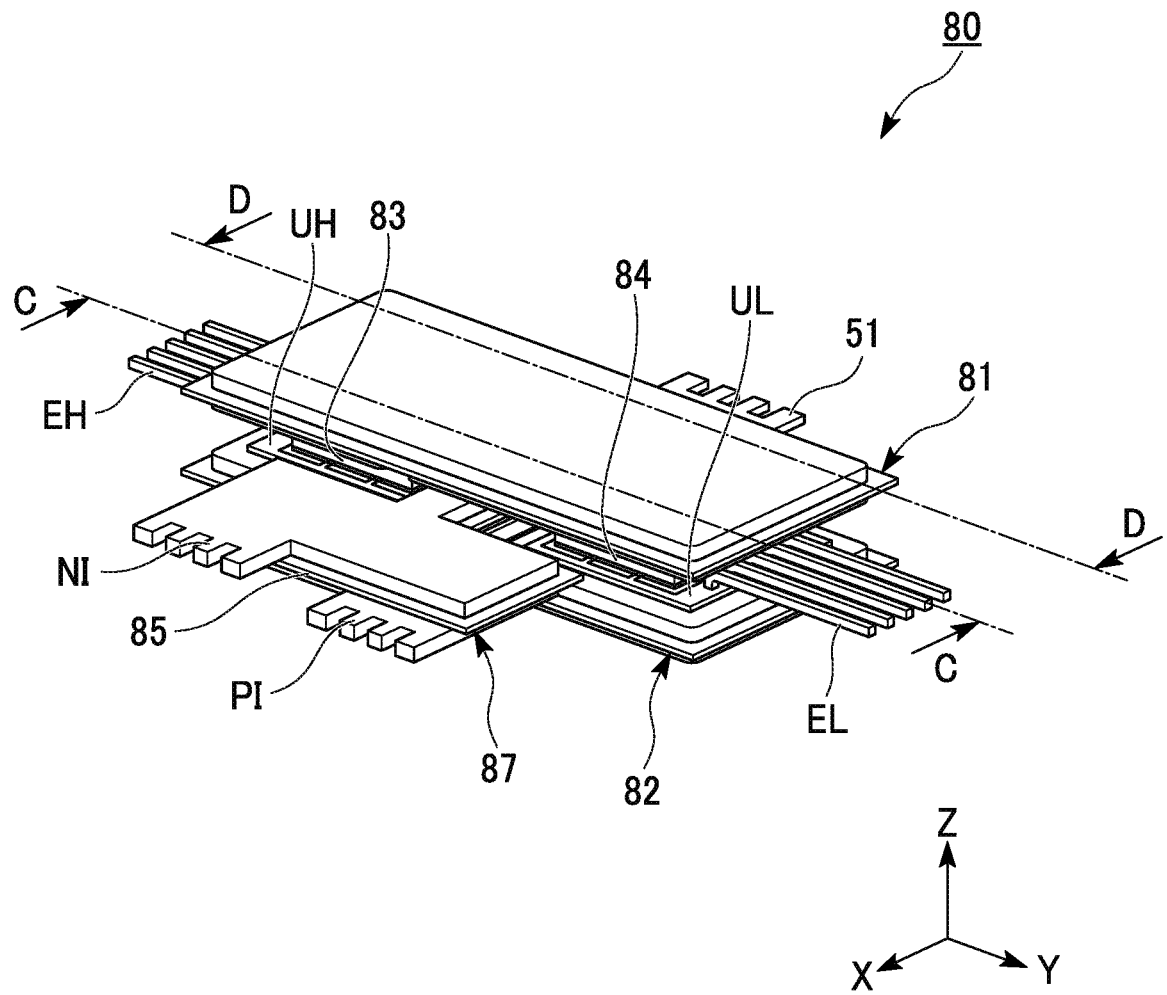
FIG. 10 is a perspective view schematically showing a constitution of an element unit according to a third example of the embodiment of the present invention.
Figure 11:
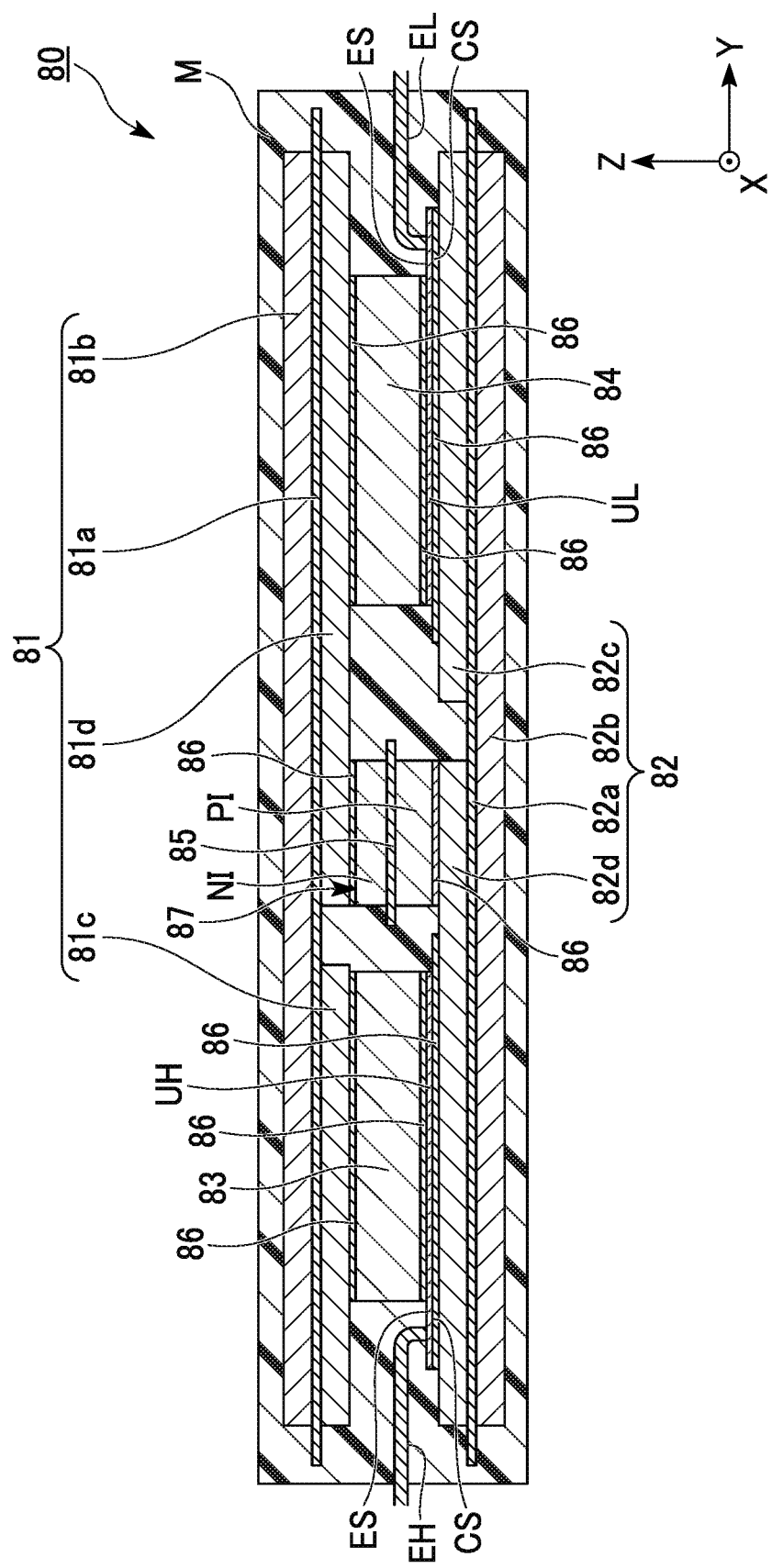
FIG. 11 is a diagram showing a current path in a cross-sectional view taken along the Y-Z plane at a position of line C-C shown in FIG. 10.
Figure 12:
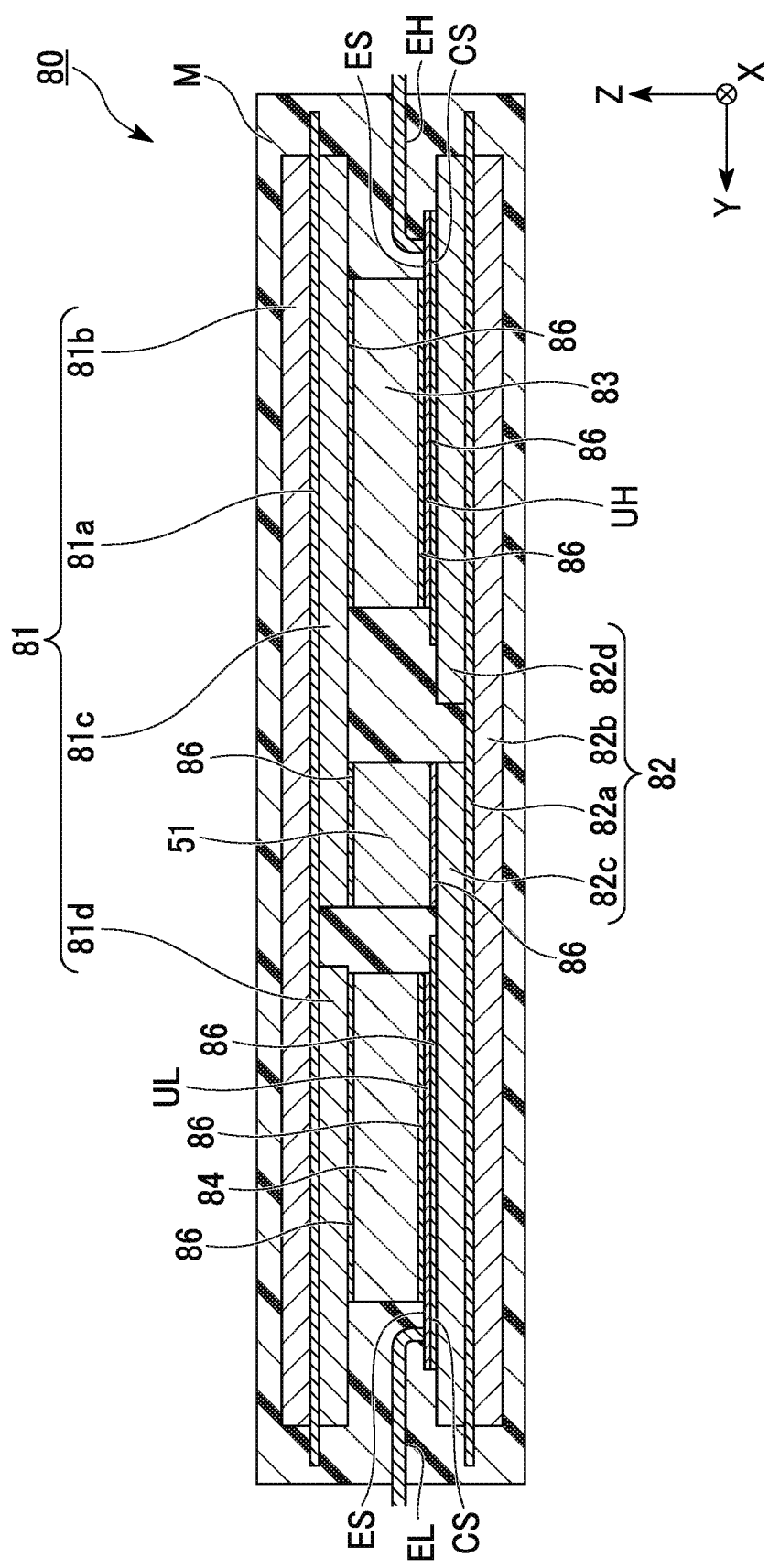
FIG. 12 is a diagram showing a current path in a cross-sectional view taken along the Y-Z plane at a position of line D-D shown in FIG. 10.
Figure 13:
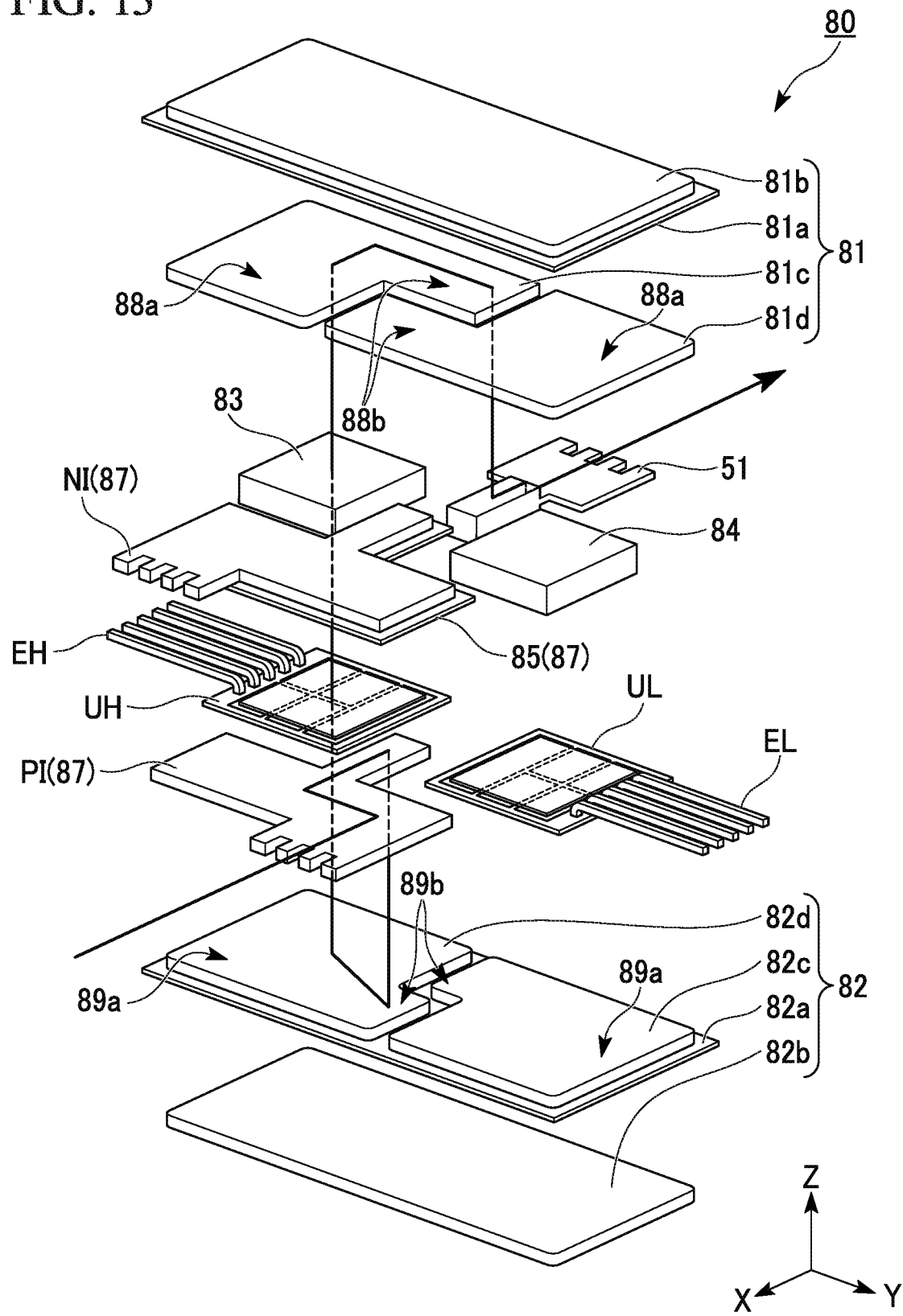
FIG. 13 is a diagram showing a current path on a positive electrode side in an exploded perspective view schematically showing the constitution of the element unit according to the third example of the embodiment of the present invention.
Figure 14:
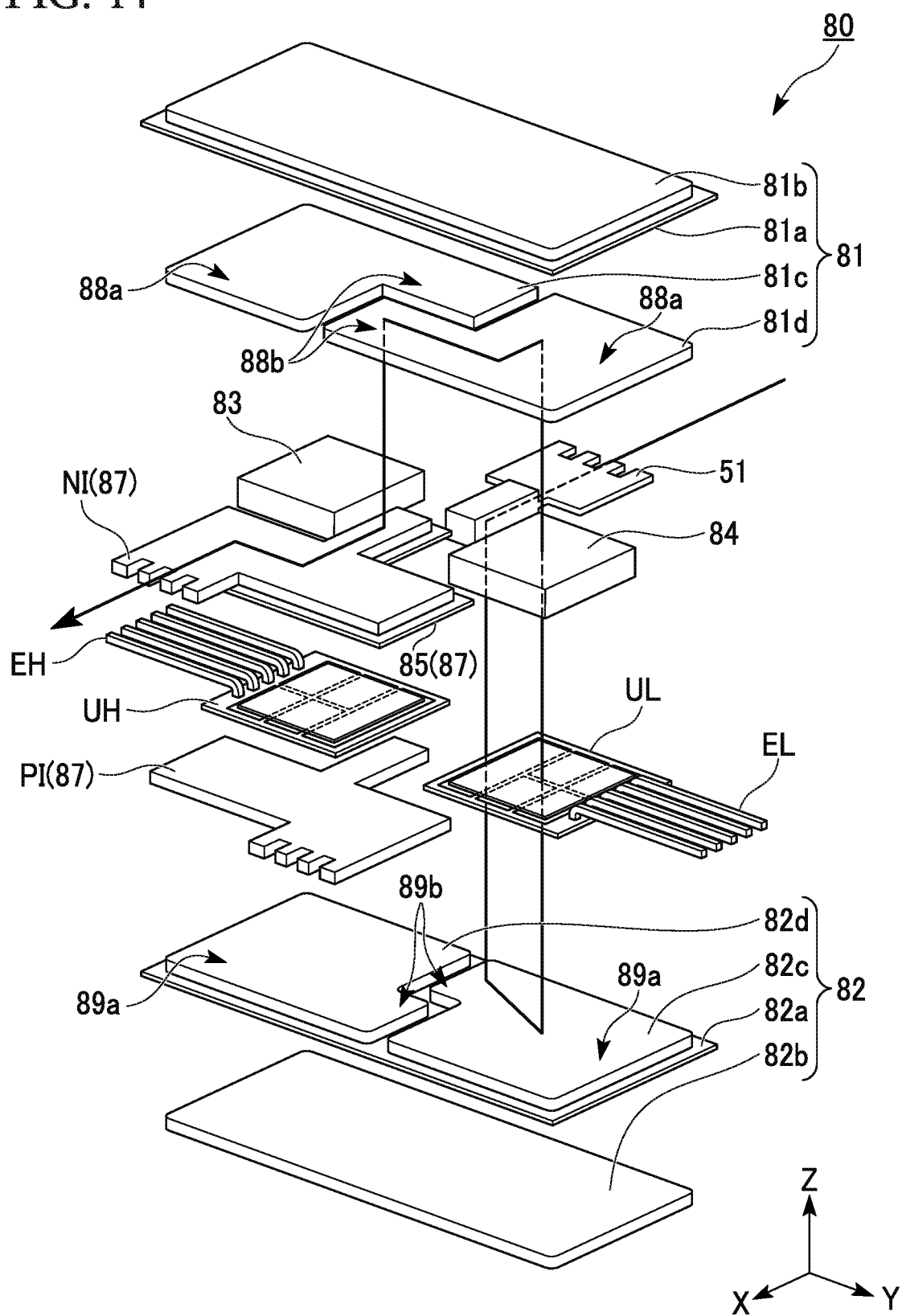
FIG. 14 is a diagram showing a current path on a negative electrode side in the exploded perspective view schematically showing the constitution of the element unit according to the third example of the embodiment of the present invention.

FIG. 10 is a perspective view schematically showing a constitution of an element unit 80 according to a third example of the embodiment of the present invention. FIG. 11 is a cross-sectional view taken along the Y-Z plane at a position of line C-C shown in FIG. 10. FIG. 12 is a cross-sectional view taken along the Y-Z plane at a position of line D-D shown in FIG. 10. FIG. 13 is a diagram showing a current path on a positive electrode side in an exploded perspective view schematically showing the constitution of the element unit according to the third example of the embodiment of the present invention. FIG. 14 is a diagram showing a current path on a negative electrode side in the exploded perspective view schematically showing the constitution of the element unit according to the third example of the embodiment of the present invention.

<Element Unit>

In the following, the constitution of the element unit 80 including the high side arm U-phase transistor UH and the low side arm U-phase transistor UL in the U-phase of the first power conversion circuit unit 31 will be described as a representative example of the element unit 80 according to the third example, like the first example and the second example.

The element unit 80 includes a resin molded body M, high side arm and low side arm U-phase transistors UH and UL, a high side arm gate electrode EH and a low side arm gate electrode EL, a first insulating substrate 81 and a second insulating substrate 82, a first conductive spacer 83 and a second conductive spacer 84, a positive electrode bus bar PI and a negative electrode bus bar NI, an insulating member 85, and a first bus bar 51.

The resin molded body M is formed by molding using an electrically insulating resin material. In the resin molded body M, all constituent components of the element unit 80 are fixed by a resin material.

The high side arm and the low side arm U-phase transistors UH and UL are located at positions which do not overlap each other when seen in a Z axis direction in a state in which front and back sides thereof are disposed in the same direction in the Z axis direction. For example, each of the transistors UH and UL is disposed between the first insulating substrate 81 and the second insulating substrate 82 in the Z axis direction so that a surface ES thereof on the emitter side faces the first insulating substrate 81 side and a surface CS thereof on the collector side faces the second insulating substrate 82 side. The high side arm and low side arm U-phase transistors UH and UL are disposed apart from each other, for example, in the Y axis direction at the same position in the Z axis direction and the X axis direction.

In the resin molded body M, each of the high side arm gate electrode EH and the low side arm gate electrode EL protrudes in the Z axis direction (for example, a positive direction of the Z axis) from the surface ES on the emitter side of each of the high side arm and low side arm U-phase transistors UH and UL and is curved in a Y axis direction (for example, each of a negative direction and a positive direction of the Y axis). Each of the high side arm gate electrode EH and the low side arm gate electrode EL has an end which protrudes outward in the Y axis direction (for example, each of the negative direction and the positive direction of the Y axis) from the resin molded body M, and each end thereof is connected to the gate drive unit 29.

The first insulating substrate 81 and the second insulating substrate 82 are disposed at positions overlapping each other at both ends of the resin molded body M in the Z axis direction when viewed in the Z axis direction. Each of the first insulating substrate 81 and the second insulating substrate 82 is constituted by an electrically insulating substrate and conductors provided on both surfaces of the substrate. For example, each of the first insulating substrate 81 and the second insulating substrate 82 is a direct copper bonding (DCB) substrate. The DCB substrate includes a ceramic substrate, and a first copper plate, a second copper plate and a third copper plate are provided on both surfaces of the ceramic substrate in a thickness direction.

The first copper plate, the second copper plate and the third copper plate sandwich the ceramic substrate from both sides in the thickness direction and are electrically insulated by the ceramic substrate. The second copper plate and the third copper plate are electrically insulated by being spaced apart from each other at a predetermined interval.

Among the first copper plate 81b, the second copper plate 81c, and the third copper plate 81d provided on the ceramic substrate 81a of the first insulating substrate 81, the first copper plate 81b is exposed outward from the resin molded body M in the Z axis direction (for example, in the positive direction of the Z axis). The first copper plate 81b is joined to a heat radiation unit (not shown) by, for example, a conductive joining material 86. For example, the joining material 86 is a solder or the like.

An outer shape of each of the second copper plate 81c and the third copper plate 81d is formed into, for example, plate shapes having the same shape. Each of the second copper plate 81c and the third copper plate 81d includes a first plate-shaped portion 88a and a second plate-shaped portion 88b which protrudes from the first plate-shaped portion 88a. The second copper plate 81c and the third copper plate 81d are disposed point-symmetrically when seen in the Z axis direction. For example, the second copper plate 81c and the third copper plate 81d are arranged and disposed at a predetermined interval in the Y axis direction and are disposed so that the mutual second plate-shaped portions 88b and 88b are arranged at a predetermined interval in the X axis direction.

In the second copper plate 81c, the first plate-shaped portion 88a is electrically joined to the first conductive spacer 83 by the joining material 86, and the second plate-shaped portion 88b is electrically joined to the first bus bar 51 by the joining material 86.

In the third copper plate 81d, the first plate-shaped portion 88a is electrically joined to the second conductive spacer 84 by the joining material 86, and the second plate-shaped portion 88b is electrically joined to the negative electrode bus bar NI by the joining material 86.

Among the first copper plate 82b, the second copper plate 82c and the third copper plate 82d provided on the ceramic substrate 82a of the second insulating substrate 82, the first copper plate 82b is exposed outward from the resin molded body M in the Z axis direction (for example, in the negative direction of the Z axis). The first copper plate 82b is joined to a heat radiation unit (not shown) by, for example, the joining material 86.

An outer shape of each of the second copper plate 82c and the third copper plate 82d is formed into, for example, a plate shape having the same shape. Each of the second copper plate 82c and the third copper plate 82d includes a first plate-shaped portion 89a and a second plate-shaped portion 89b which protrudes from the first plate-shaped portion 89a. The second copper plate 82c and the third copper plate 82d are disposed point-symmetrically when seen in the Z axis direction. For example, the second copper plate 82c and the third copper plate 82d are arranged and disposed at a predetermined interval in the Y axis direction and are disposed so that the mutual second plate-shaped portions 89b and 89b are arranged at a predetermined interval in the X axis direction.

In the second copper plate 82c, the first plate-shaped portion 89a is electrically joined to the surface CS on the collector side of the low side arm U-phase transistor UL by the joining material 86, and the second plate-shaped portion 89b is electrically joined to the first bus bar 51 by the joining material 86.

In the third copper plate 82d, the first plate-shaped portion 89a is electrically joined to the surface CS on the collector side of the high side arm U-phase transistor UH by the joining material 86, and the second plate-shaped portion 89b is electrically joined to the positive electrode bus bar PI by the joining material 86.

Each of the first conductive spacer 83 and the second conductive spacer 84 is a conductor formed in a plate shape, for example, like a copper plate or the like. The first conductive spacer 83 is disposed between the first insulating substrate 81 and the high side arm U-phase transistor UH in the Z axis direction and is electrically joined to the first plate-shaped portion 88a of the second copper plate 81c of the first insulating substrate 81 and the surface ES on the emitter side of the high side arm U-phase transistor UH by the respective joining materials 86. The second conductive spacer 84 is disposed between the low side arm U-phase transistor UL and the first insulating substrate 81 in the Z axis direction and is electrically joined to the surface ES on the emitter side of the low side arm U-phase transistor UL and the first plate-shaped portion 88a of the third copper plate 81d of the first insulating substrate 81 by the respective joining materials 86.

The positive electrode bus bar PI, the negative electrode bus bar NI, and the insulating member 85 constitute a conductor set 87. For example, the conductor set 87 is a direct copper bonding (DCB) substrate, each of the positive electrode bus bar PI and the negative electrode bus bar NI is a copper plate, and the insulating member 85 is a ceramic substrate. The positive electrode bus bar PI and the negative electrode bus bar NI are disposed to face each other while spaced apart in the Z axis direction, sandwich the insulating member 85 from both sides in the Z axis direction, and be electrically insulated by the insulating member 85. Each of the positive electrode bus bar PI and the negative electrode bus bar NI has an end which protrudes outward from the resin molded body M in an X axis direction (for example, in the positive direction of the X axis), and each of the ends is connected to each of the positive electrode bus bar 50$p$ and the negative electrode bus bar 50$n$ of the capacitor unit 23.

The positive electrode bus bar PI is electrically joined to the second plate-shaped portion 89$b$ of the third copper plate 82$d$ of the second insulating substrate 82 by the joining material 86 in the resin molded body M. The negative electrode bus bar NI is electrically connected to the second plate-shaped portion 88$b$ of the third copper plate 81$d$ of the first insulating substrate 81 by the joining material 86 in the resin molded body M.

In the Z axis direction of the element unit 80, the second copper plate 82$c$ and the third copper plate 82$d$ of the second insulating substrate 82, the high side arm and low side arm U-phase transistors UH and UL, the first conductive spacer 83 and the second conductive spacer 84, and the second copper plate 81$c$ and the third copper plate 81$d$ of the first insulating substrate 81 are sequentially disposed.

In the Z axis direction of the element unit 80, the third copper plate 82$d$ of the second insulating substrate 82, the positive electrode bus bar PI, the insulating member 85, the negative electrode bus bar NI, and the third copper plate 81$d$ of the first insulating substrate 81 are sequentially disposed.

When seen in the Z axis direction, the third copper plate 82$d$ of the second insulating substrate 82, the high side arm U-phase transistor UH, the first conductive spacer 83, and the second copper plate 81$c$ of the first insulating substrate 81 have portions which sequentially overlap each other.

When seen in the Z axis direction, the second copper plate 82$c$ of the second insulating substrate 82, the low side arm U-phase transistor UL, the second conductive spacer 84, and the third copper plate 81$d$ of the first insulating substrate 81 have portions which sequentially overlap each other.

When seen in the Z axis direction, the first conductive spacer 83, the high side arm U-phase transistor UH, and the second conductive spacer 84, and the low side arm U-phase transistor UL are disposed not to overlap each other when seen in the Z axis direction (for example, not to have portions which are spaced apart from each other in the Y axis direction and do not overlap each other).

The first bus bar 51 is a plate-shaped conductor, like the copper plate. When seen in the Z axis direction, the first bus bar 51 is disposed at a position which does not overlap the positive electrode bus bar PI and the negative electrode bus bar NI. In the resin molded body M, the first bus bar 51 extends in the Z axis direction between the first insulating substrate 81 and the second insulating substrate 82 and is electrically joined to the second copper plate 81$c$ of the first insulating substrate 81 and the second copper plate 82$c$ of the second insulating substrate 82 by the respective joining material 86.

The first bus bar 51 has a protruding portion which protrudes outward from the resin molded body M in the X axis direction (for example, in the positive direction of the X axis), and the protruding portion is connected to the U-phase stator winding of the first motor 12 via the first input/output terminal Q1 and the first three-phase connector 1$b$.

As shown in FIG. 13, the current path on the positive electrode side in the element unit 80 of the third example is sequentially constituted by the positive electrode bus bar PI, the third copper plate 82$d$ of the second insulating plate 82, the high side arm U-phase transistor UH, the first conductive spacer 83, the second copper plate 81$c$ of the first insulating substrate 81, and the first bus bar 51. As shown in FIG. 14, the current path on the negative electrode side is sequentially constituted by the first bus bar 51, the second copper plate 82$c$ of the second insulating substrate 82, the low side arm U-phase transistor UL, the second conductive spacer 84, the third copper plate 81$d$ of the first insulating substrate 81, and the negative electrode bus bar NI.

Hereinafter, an assembling process of the element unit 80 according to the third example will be described. FIGS. 15 to 18 are perspective views schematically showing first to fourth states in the assembling process of the element unit 80.

Figure 15:
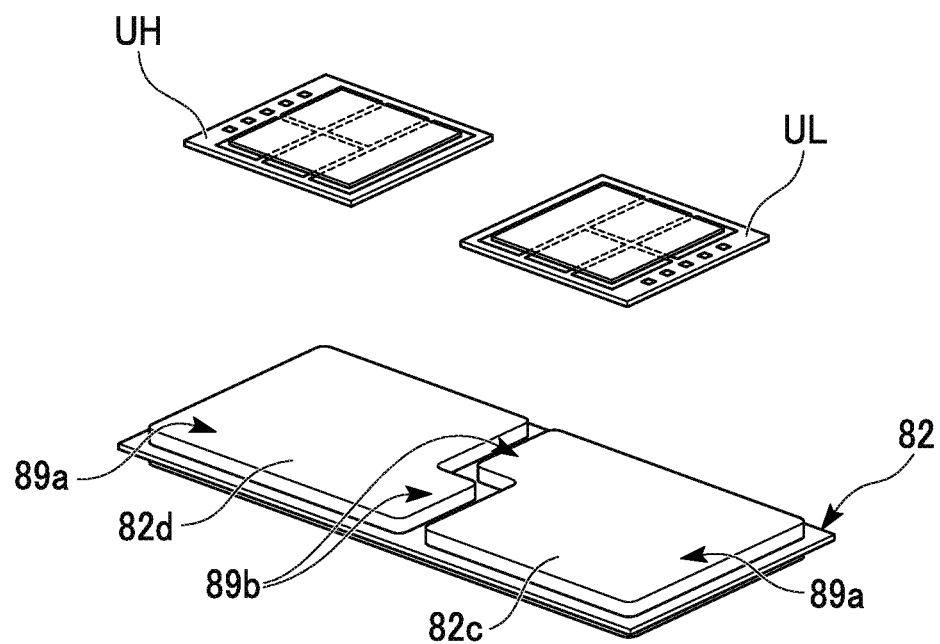
FIG. 15 is a perspective view schematically showing a first state in an assembly process of the element unit according to the third example of the embodiment of the present invention.
Figure 15:
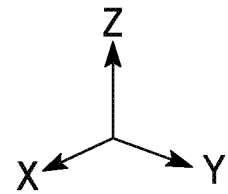

First, as shown in FIG. 15, the surface CS on the collector side of the high side arm U-phase transistor UH is joined to the first plate-shaped portion 89$a$ of the third copper plate 82$d$ of the second insulating substrate 82 by the joining material 86. The surface CS on the collector side of the low side arm U phase transistor UL is joined to the first plate-shaped portion 89$a$ of the second copper plate 82$c$ of the second insulating substrate 82 by the joining material 86.

Figure 16:
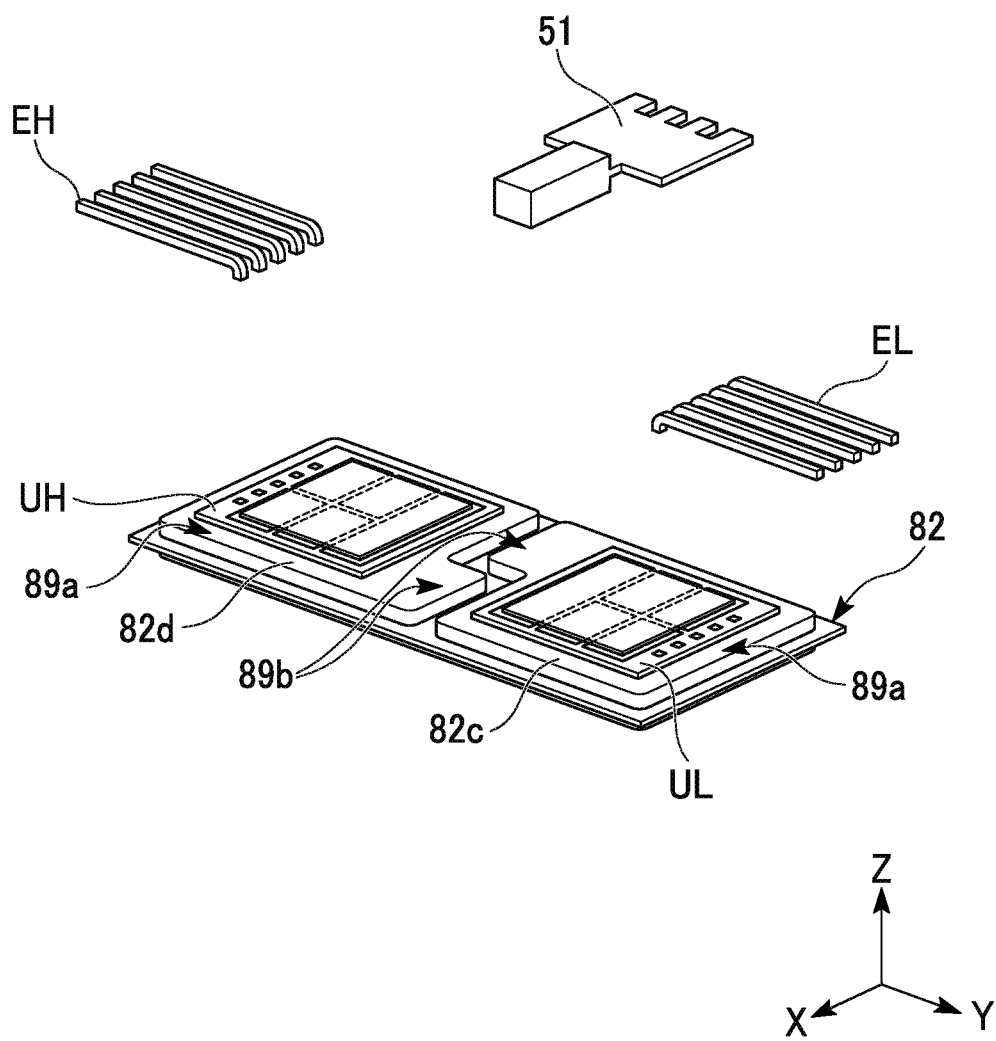
FIG. 16 is a perspective view schematically showing a second state in an assembly process of the element unit according to the third example of the embodiment of the present invention.

Next, as shown in FIG. 16, the high side arm gate electrode EH is joined from the surface ES on the emitter side of the high side arm U-phase transistor UH by the joining material 86. The low side arm gate electrode EL is joined from the surface ES on the emitter side of the low side arm U-phase transistor UL by the joining material 86. The first bus bar 51 is joined to the second plate-shaped portion 89$b$ of the second copper plate 82$c$ of the second insulating substrate 82 by the joining material 86.

Figure 17:
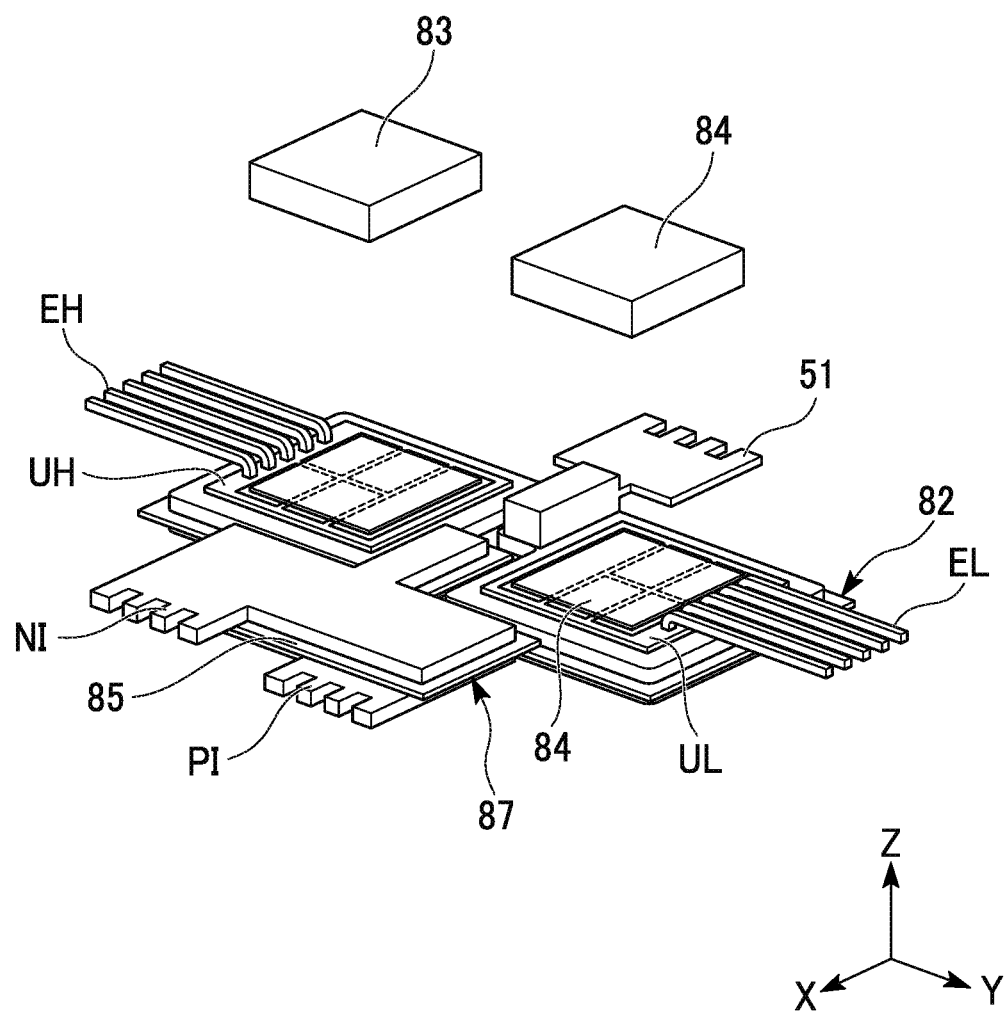
FIG. 17 is a perspective view schematically showing a third state in an assembly process of the element unit according to the third example of the embodiment of the present invention.

Next, as shown in FIG. 17, the positive electrode bus bar PI of the conductor set 87 is joined to the second plate-shaped portion 89$b$ of the third copper plate 82$d$ of the second insulating substrate 82 by the joining material 86. The first conductive spacer 83 is joined to the surface ES on the emitter side of the high side arm U-phase transistor UH by the joining material 86. The second conductive spacer 84 is joined to the surface ES on the emitter side of the low side arm U-phase transistor UL by the joining material 86.

Figure 18:
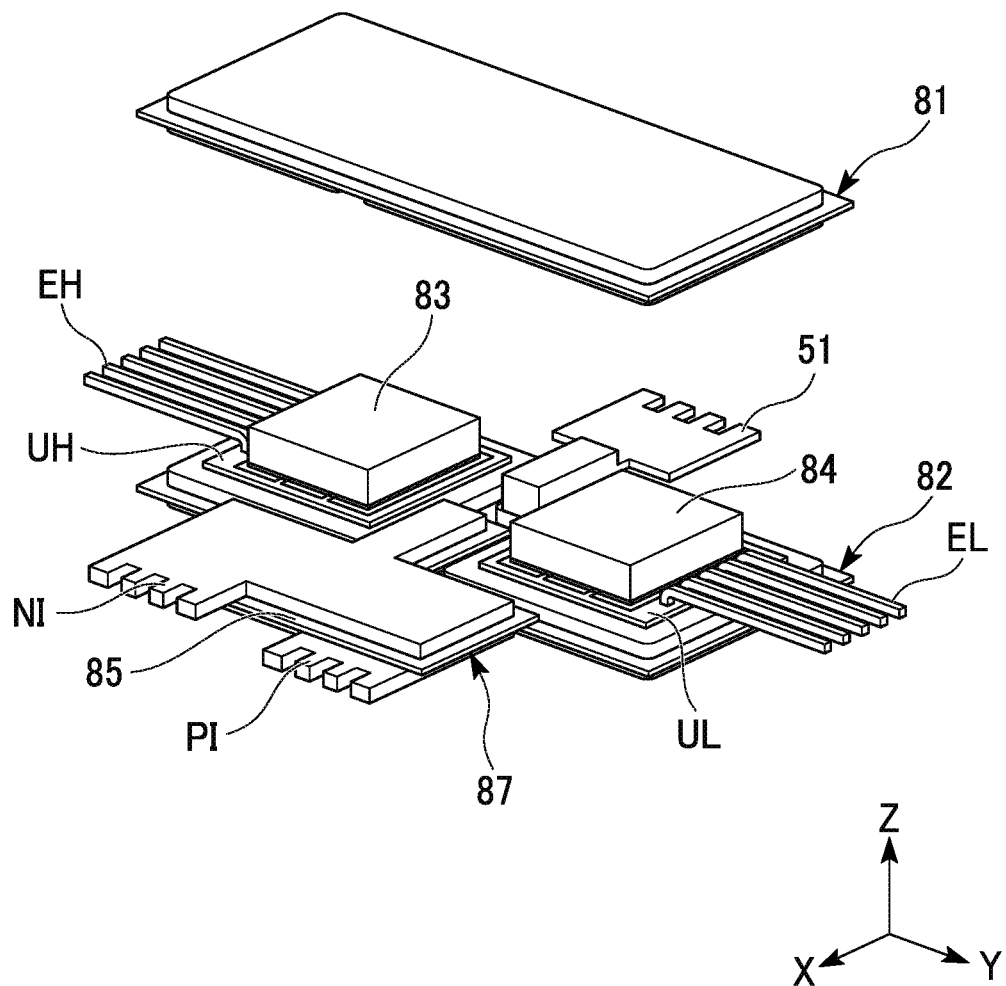
FIG. 18 is a perspective view schematically showing a fourth state in an assembly process of the element unit according to the third example of the embodiment of the present invention.

Next, as shown in FIG. 18, the first plate-shaped portion 88$a$ of the second copper plate 81$c$ of the first insulating substrate 81 is joined to the first conductive spacer 83 by the joining material 86. The first plate-shaped portion 88$a$ of the third copper plate 81$d$ of the first insulating substrate 81 is joined to the second conductive spacer 84 by the joining material 86.

Thus, a series of processes is completed.

Although the element unit 80 in the U-phase of the first power conversion circuit unit 31 has been described above, the element unit 80 in each of the V-phase and W-phase of the first power conversion circuit unit 31 includes the V-phase transistors VH and VL or the W-phase transistors WH and WL instead of the U-phase transistors UH and UL. Also, the element unit 80 in each phase of the second power conversion circuit unit 32 includes the second bus bar 52 instead of the first bus bar 51.

Also, in comparison with the element unit 80 in the U-phase of the first power conversion circuit unit 31, the element unit 80 of the third power conversion circuit unit 33 includes the first and second transistors S1 and S2 instead of each of the U-phase transistors UH and UL, includes the positive electrode bus bar PV and the negative electrode bus bar NV instead of the positive electrode bus bar PI and the negative electrode bus bar NI, and includes the third bus bar 53 instead of the first bus bar 51.

As described above, according to the element unit 80 according to the third example of the embodiment, when seen in the Z axis direction, since each of the transistors UH (VH, WH, S1) of the high side arm and each of the transistors UL (VL, WL, S2) of the low side arm are disposed at positions which do not overlap each other, it is possible to minimize mutual thermal interference.

Further, each of the transistors UH (VH, WH, S1) of the high side arm and each of the transistors UL (VL, WL, S2) of the low side arm can be cooled from both sides in the Z axis direction by the first conductive spacer 83, the second conductive spacer 84, and the second copper substrate 82c and the third copper plate 82d of the second insulating substrate 82, and thus can suppress an increase in thermal resistance and improve the cooling performance.

Furthermore, since each of the transistors UH (VH, WH, S1) of the high side arm and each of the transistors UL (VL, WL, S2) of the low side arm is disposed at the position which does not overlap the conductor set 87 when seen in the Z axis direction, it is possible to restrain an increase in a thickness in the Z axis direction while suppressing the increase in the thermal resistance. The increase in the stray inductance can be suppressed by restraining the increase in the thickness of the element unit 80 in the Z axis direction and disposing it in a compact manner.

Also, in the above-described example, the power conversion device 1 is mounted on the vehicle 10, but it is not limited thereto and may be mounted on other devices.

The embodiments of the present invention have been presented as examples and are not intended to limit the scope of the invention. These embodiments can be implemented in various other modes, and various omissions, substitutions, and changes can be made without departing from the gist of the invention. These embodiments and modifications thereof are included in the scope and gist of the invention, as well as within the scope of the invention described in the claims and their equivalents.

What is claimed is:

1. An element unit comprising:
    a high side arm element;
    a low side arm element;
    a conductor set formed by disposing a positive electrode side conductor, which is electrically connected to a first surface of the high side arm element, and a negative electrode side conductor, which is electrically connected to a first surface of the low side arm element, to face each other while spaced apart in a predetermined direction;
    a first conductor electrically connected to a second surface of the high side arm element;
    a second conductor electrically connected to a second surface of the low side arm element;
    an input/output conductor electrically connected to the high side arm element and the low side arm element,
    wherein the input/output conductor extends in the predetermined direction between the first conductor and the second conductor and is electrically connected to the first conductor and the second conductor; and
    a third conductor electrically connected to the first surface of the high side arm element and the positive electrode side conductor, and a fourth conductor electrically connected to the first surface of the low side arm element and the negative electrode side conductor,
    wherein the third conductor, the positive electrode side conductor, the negative electrode side conductor, and the fourth conductor are sequentially disposed in the predetermined direction,
    the third conductor, the high side arm element, and the first conductor have portions which sequentially overlap when seen in the predetermined direction, and
    the second conductor, the low side arm element, and the fourth conductor have portions which sequentially overlap when seen in the predetermined direction.

2. The element unit according to claim 1, wherein the second conductor, the low side arm element, the negative electrode side conductor, the positive electrode side conductor, the high side arm element, and the first conductor are sequentially disposed in the predetermined direction.

3. The element unit according to claim 2, wherein the high side arm element, the conductor set, and the low side arm element have portions which overlap each other when seen in the predetermined direction.

4. The element unit according to claim 2, wherein the conductor set has portions which overlap the high side arm element and the low side arm element when seen in the predetermined direction, and
    the high side arm element and the low side arm element are disposed at positions which do not overlap each other when seen in the predetermined direction.

5. The element unit according to claim 1, wherein the input/output conductor is disposed at a position which does not overlap the positive electrode side conductor and the negative electrode side conductor when seen in the predetermined direction.

* * * * *